United States Patent
Masuoka et al.

(10) Patent No.: US 12,027,627 B2
(45) Date of Patent: *Jul. 2, 2024

(54) PILLAR-SHAPED SEMICONDUCTOR DEVICE HAVING CONNECTION MATERIAL LAYER FOR ANCHORING WIRING CONDUCTOR LAYER AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 123 days.

This patent is subject to a terminal disclaimer.

(21) Appl. No.: 17/693,941

(22) Filed: Mar. 14, 2022

(65) Prior Publication Data

US 2022/0199837 A1   Jun. 23, 2022

Related U.S. Application Data

(60) Division of application No. 16/580,510, filed on Sep. 24, 2019, now Pat. No. 11,309,426, which is a
(Continued)

(51) Int. Cl.
*H01L 29/786* (2006.01)
*H01L 21/225* (2006.01)
(Continued)

(52) U.S. Cl.
CPC .... *H01L 29/78642* (2013.01); *H01L 21/2251* (2013.01); *H01L 21/324* (2013.01);
(Continued)

(58) Field of Classification Search
CPC .......... H01L 29/78642; H01L 21/2251; H01L 21/324; H01L 29/401; H01L 29/41733;
(Continued)

(56) References Cited

U.S. PATENT DOCUMENTS 11,309,426 B2 * 4/2022 Masuoka ............ H01L 29/7848
2013/0240965 A1   9/2013 Park et al.
(Continued)

FOREIGN PATENT DOCUMENTS

JP   H02-188966 A   7/1990
JP   H06-013623 A   1/1994
(Continued)

OTHER PUBLICATIONS

International Preliminary Report on Patentability in Application No. PCT/JP2017/012244, dated Jun. 20, 2017, 8 pages.
(Continued)

*Primary Examiner* — Nelson Garces
(74) *Attorney, Agent, or Firm* — Crowell & Moring LLP

(57) ABSTRACT

An SGT circuit includes a first conductor layer which contains a semiconductor atom, which is in contact with an $N^+$ region and a $P^+$ region of a Si pillar, or a TiN layer, and whose outer circumference is located outside an outer circumference of a $SiO_2$ layer in plan view, and a second conductor layer which contains a metal atom, which is connected to an outer periphery of the first conductor layer, and which extends in a horizontal direction.

4 Claims, 17 Drawing Sheets

Related U.S. Application Data continuation of application No. PCT/JP2017/012244, filed on Mar. 27, 2017.

(51) Int. Cl.

| | |
|---|---|
| *H01L 21/324* | (2006.01) |
| *H01L 27/092* | (2006.01) |
| *H01L 29/40* | (2006.01) |
| *H01L 29/417* | (2006.01) |
| *H01L 29/423* | (2006.01) |
| *H01L 29/66* | (2006.01) |

(52) U.S. Cl.
CPC .......... *H01L 27/092* (2013.01); *H01L 29/401* (2013.01); *H01L 29/41733* (2013.01); *H01L 29/41741* (2013.01); *H01L 29/42392* (2013.01); *H01L 29/66666* (2013.01)

(58) Field of Classification Search
CPC ......... H01L 29/41741; H01L 29/66666; H01L 29/42392
See application file for complete search history.

(56) References Cited

U.S. PATENT DOCUMENTS

| | | | | |
|---|---|---|---|---|
| 2016/0155842 | A1* | 6/2016 | Masuoka .......... | H01L 29/42392 257/329 |
| 2020/0020812 | A1 | 1/2020 | Masuoka | |

FOREIGN PATENT DOCUMENTS

| | | |
|---|---|---|
| JP | 5639317 B | 12/2014 |
| JP | 5841696 B1 | 1/2016 |
| JP | 2016-046271 A | 4/2016 |
| JP | 2016-122678 A | 7/2016 |
| JP | 2016-184750 A | 10/2016 |
| WO | WO2016/110981 A | 7/2016 |
| WO | WO2017/006468 A | 1/2017 |

OTHER PUBLICATIONS

International Preliminary Report on Patentability in Application No. PCT/JP2017/012244, dated Jan. 16, 2018, 4 pages.
Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
Tadashi Shibata, Susumu Kohyama and Hisakazu Iizuka: "A New Field Isolation Technology for High Density MOS LSI", Japanese Journal of Applied Physics, vol. 18, pp. 263-267 (1979).
C.Y.Ting, V.J.Vivalda, and H.G.Schaefer:"Study of planarized sputter-deposited SiO2" J.Vac.Sci.Technol, 15(3), May/Jun. (1978).
T.Morimoto, T.Ohguro, H.Sasaki, M.S.Momose, T.Iinuma, I.Kunishima, K.Suguro, I.Katakabe, H.Nakajima, M.Tsuchiaki, M.Ono, Y.Katsumata, and H.Iwai: "Self-Aligned Nickel-Mono-Silicide Technology for High-Speed Deep Submicrometer Logic CMOS ULSI" IEEE Transaction on Electron Devices, vol. 42, No. 5, pp. 915-922 (1995).
Shyam Gannavaram, Nemanja Pesovic & Mehmet C. Qzturk : "Low Temperature(<800° C.) Recessed Junction Selective Silicon-Germanium Source-Drain Technology for 70nm CMOS" IEDM 2000 Technical Digest, pp. 437-440 (2000).
H.Itoh, T.Moriya, and M.Kashiwagi : "Selective CVD of tungsten and its applications to MOSLSI", Solid-State Techn., November, pp. 83 (1986).
English translation of International Preliminary Report on Patentability for PCT/JP2017/012244, dated Aug. 7, 2018, 5 pages.
Itoh et al., "Tungsten Selective CVD and its LSI Metallization", Journal of the Japan Institute of Metals and Materials, vol. 28, No. 1, (1986), including English translation, 12 pages.

\* cited by examiner

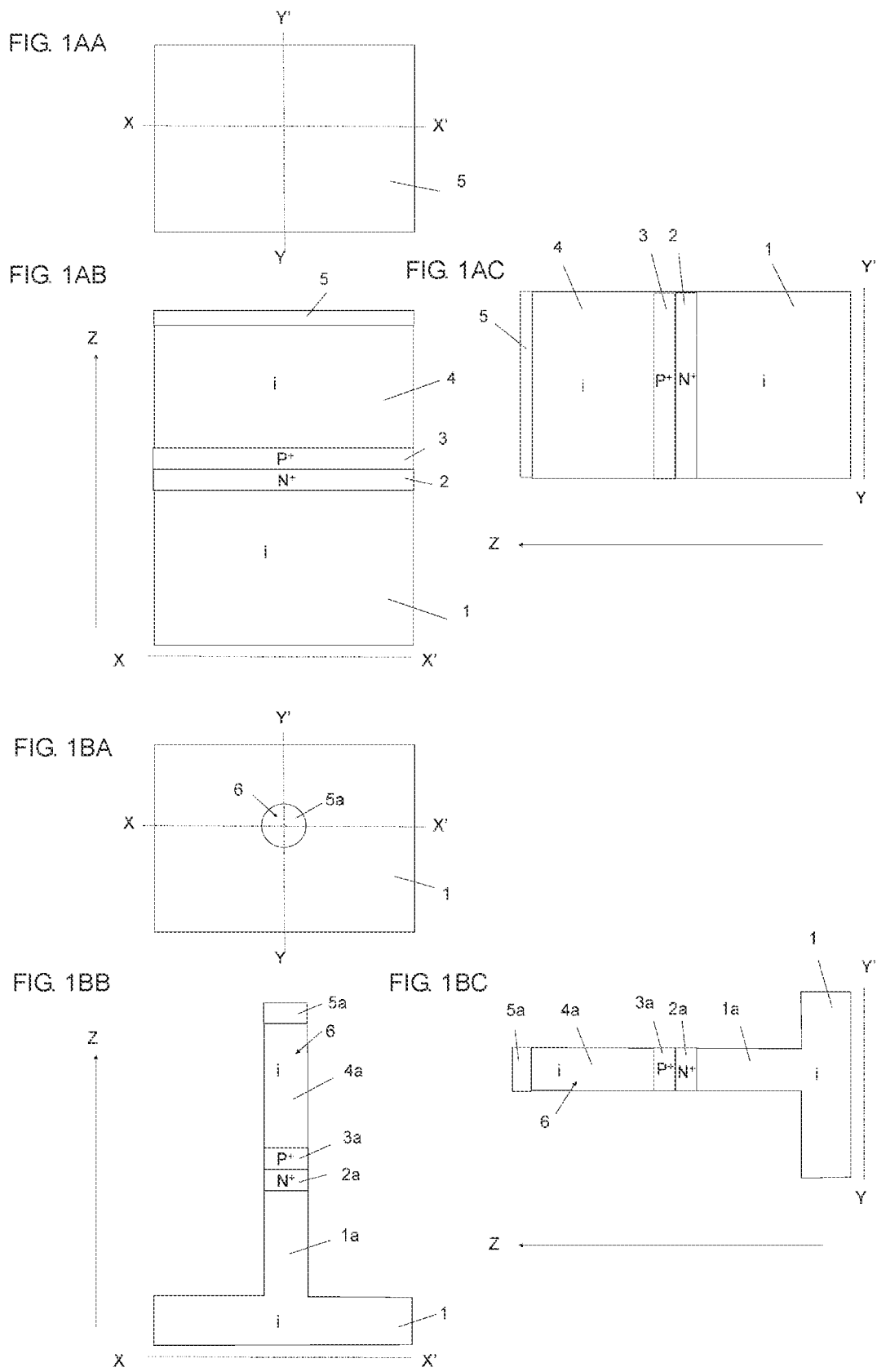

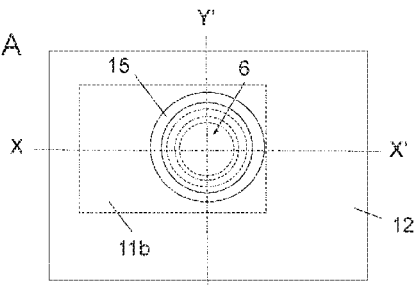
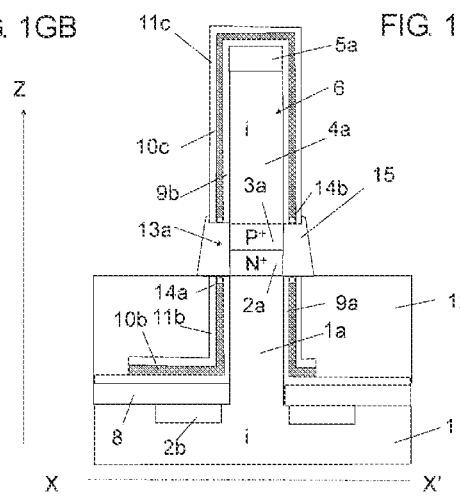
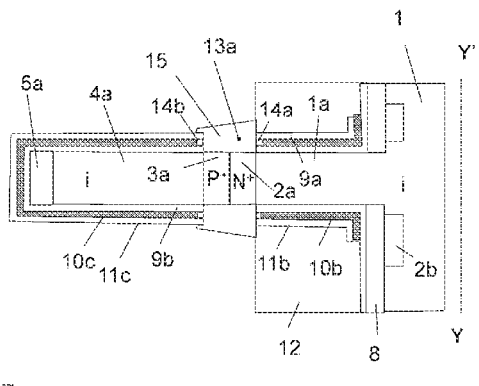
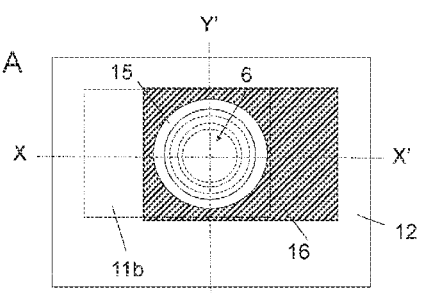
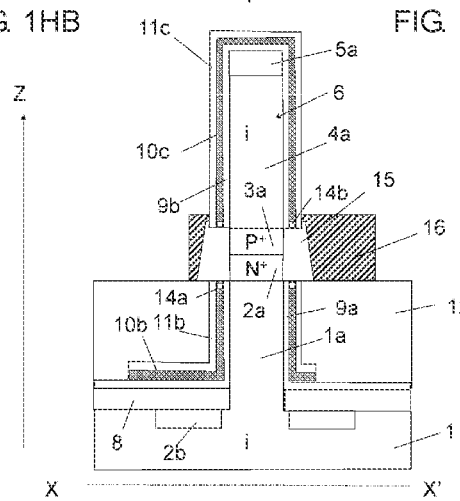
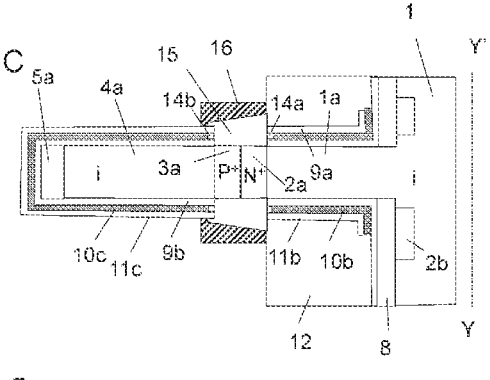

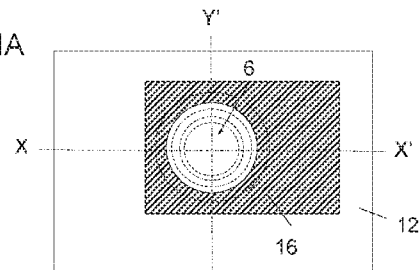
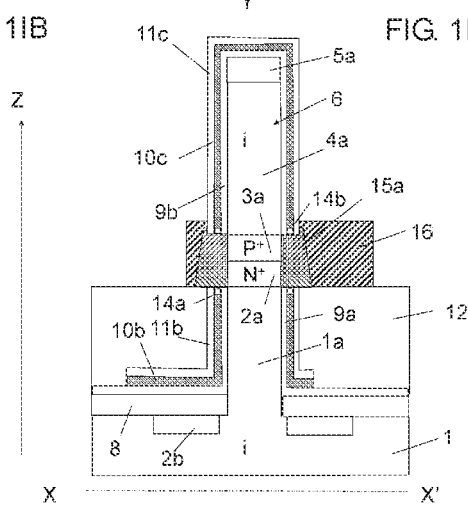
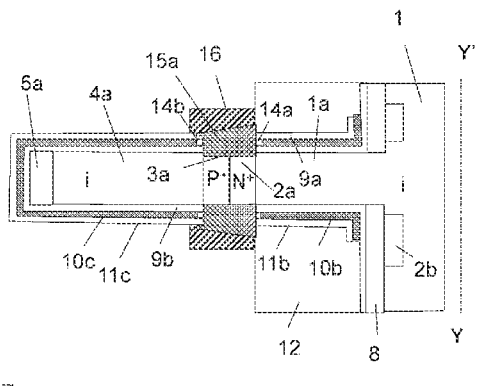
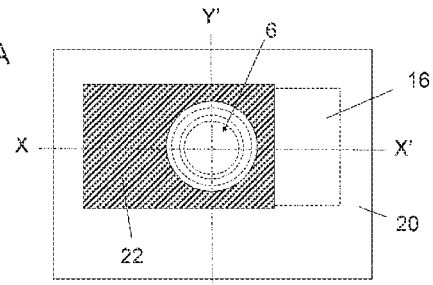
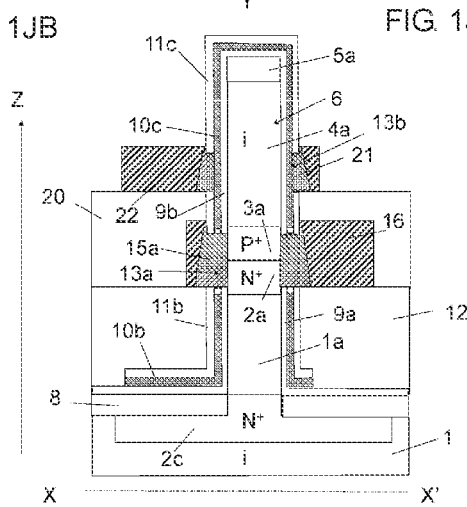
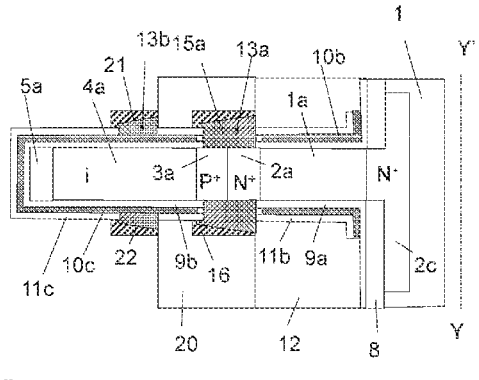

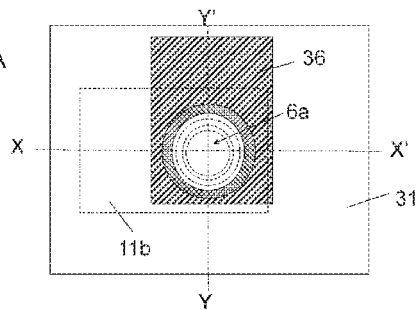
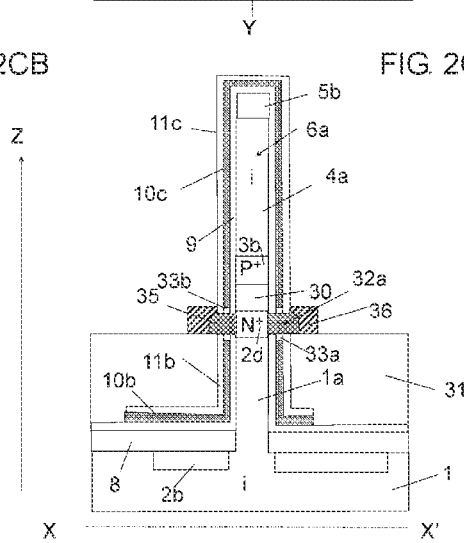
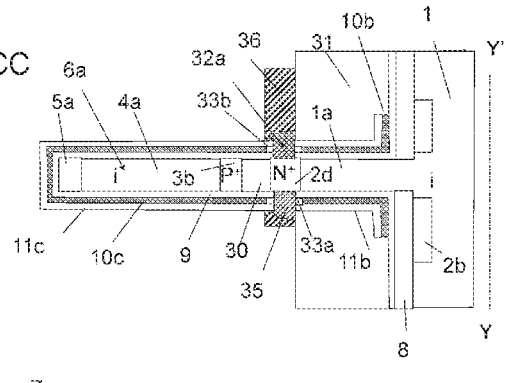
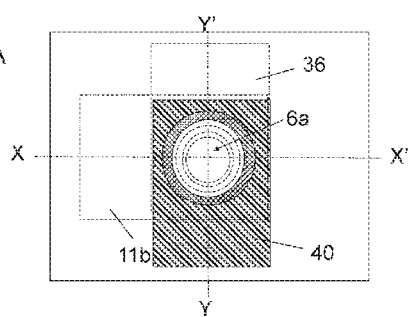
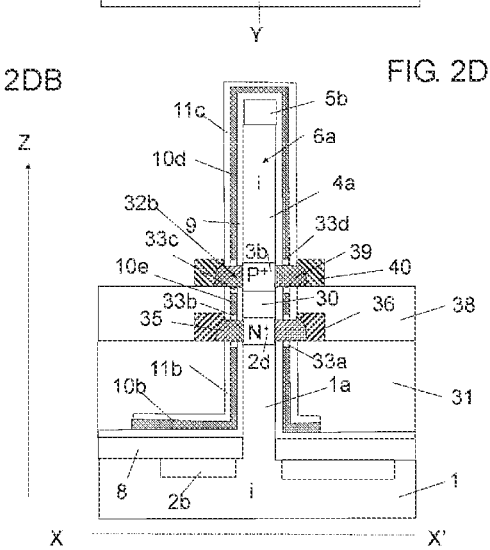
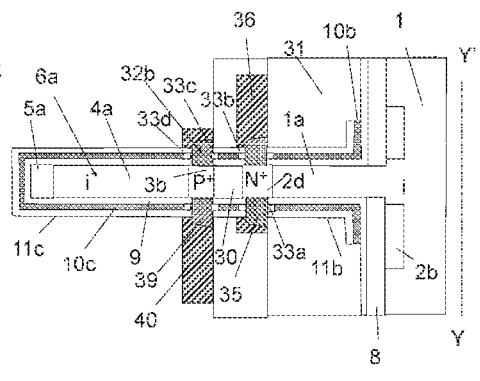

FIG. 4AA
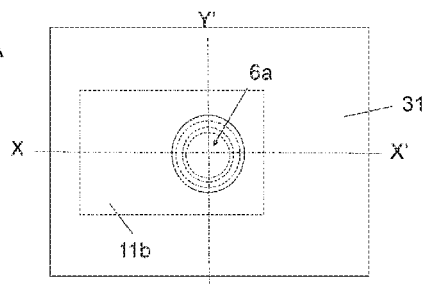
FIG. 4AB
FIG. 4AC
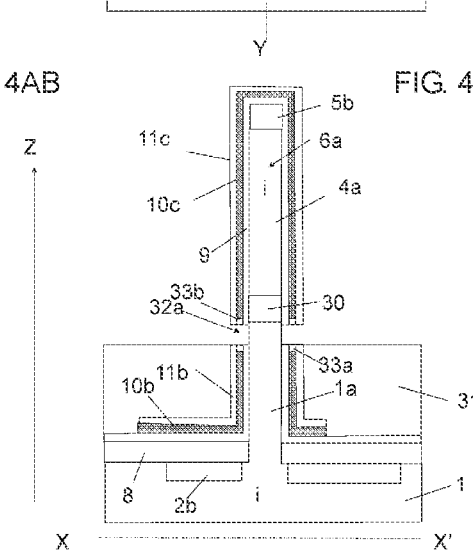
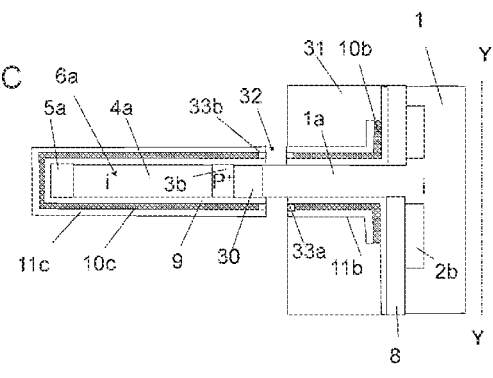
FIG. 4BA
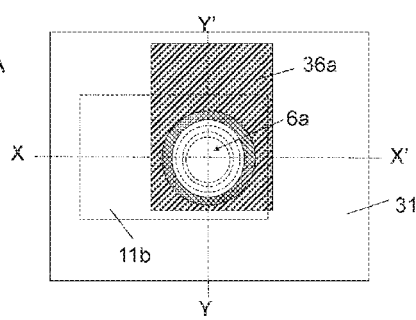
FIG. 4BB
FIG. 4BC
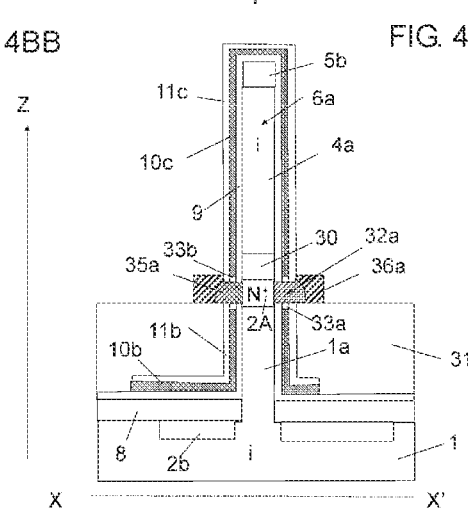
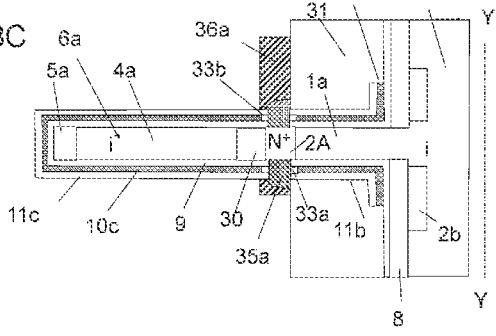

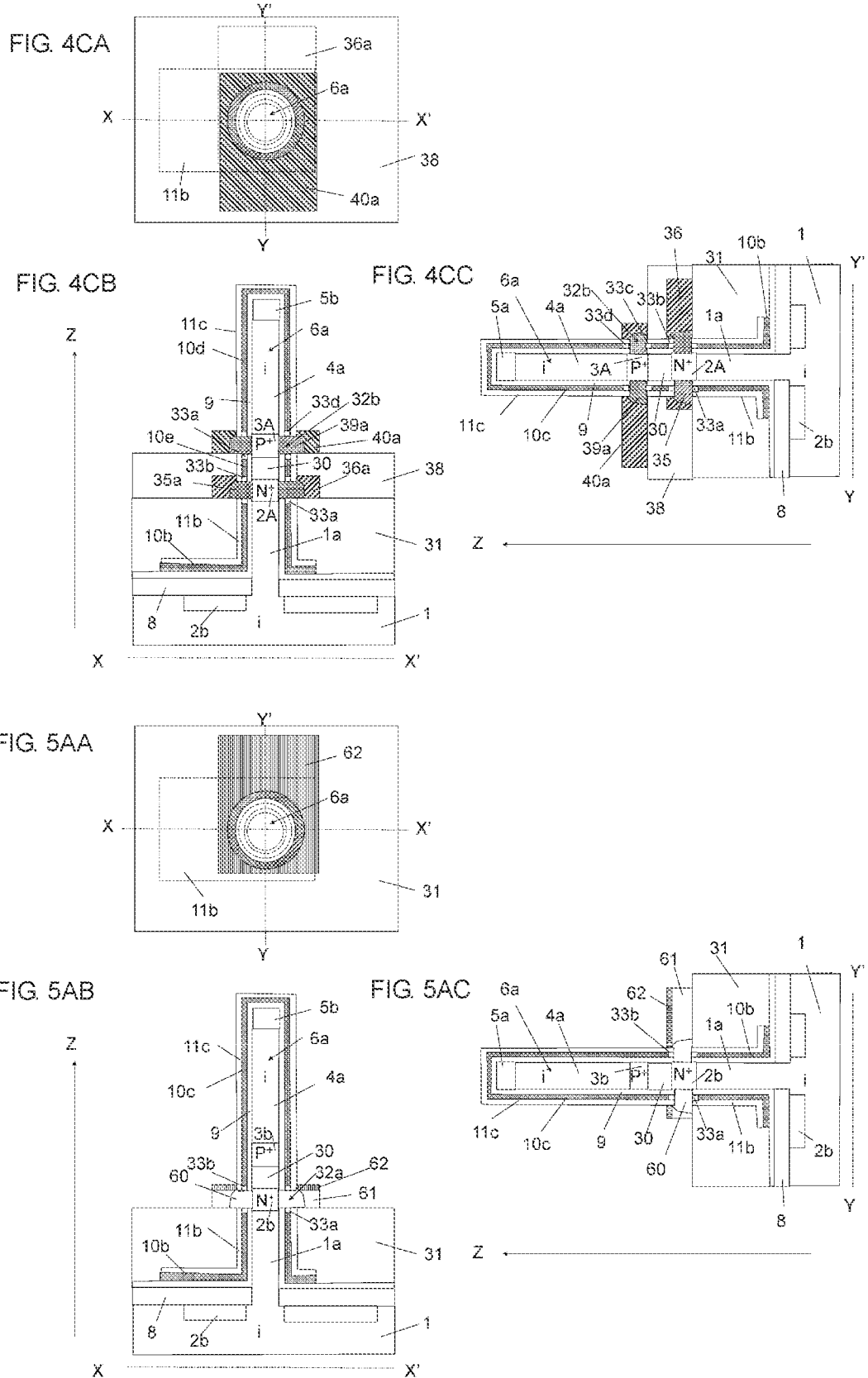

PILLAR-SHAPED SEMICONDUCTOR DEVICE HAVING CONNECTION MATERIAL LAYER FOR ANCHORING WIRING CONDUCTOR LAYER AND METHOD FOR PRODUCING THE SAME

CROSS REFERENCES TO RELATED APPLICATIONS

The present application is a divisional application of U.S. application Ser. No. 16/580,510 filed Sep. 24, 2019, which is a continuation application of PCT/JP2017/012244, filed Mar. 27, 2017, the entire contents of which are incorporated herein by reference.

BACKGROUND OF THE INVENTION

1. Field of the Invention

The present invention relates to a pillar-shaped semiconductor device and a method for producing the pillar-shaped semiconductor device.

2. Description of the Related Art

In recent years, surrounding gate MOS transistors (SGTs), which are typical pillar-shaped semiconductor devices, have attracted attention as semiconductor elements that provide highly integrated semiconductor devices. A further increase in the degree of integration of SGT-including semiconductor devices has been desired.

Ordinary planar MOS transistors have a channel that is present in a horizontal direction along an upper surface of a semiconductor substrate. In contrast, SGTs have a channel that is present in a direction perpendicular to an upper surface of a semiconductor substrate (refer to, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Therefore, SGTs enable an increase in the density of semiconductor devices compared with planar MOS transistors.

Currently, further efforts for reducing the size of circuit chips that include SGTs have been made. For example, as illustrated in a schematic structural view of FIG. 10, it has been expected that the circuit area can be reduced by forming two SGTs 116a and 116b at a lower position and an upper position of one Si pillar 115.

FIG. 10 is a schematic structural view of a CMOS inverter circuit that includes an N-channel SGT 116a formed in a lower portion of a Si pillar 115 and a P-channel SGT 116b formed in an upper portion of the Si pillar 115. The Si pillar 115 is formed on a P-layer substrate 117 (hereinafter, a semiconductor layer containing an acceptor impurity is referred to as a "P layer"). A $SiO_2$ layer 118 is formed at the outer periphery of the Si pillar 115 and on the P-layer substrate 117. A gate insulating layer 119a of the N-channel SGT 116a and a gate insulating layer 119b of the P-channel SGT 116b are formed so as to surround the Si pillar 115. A gate conductor layer 120a of the N-channel SGT 116a and a gate conductor layer 120b of the P-channel SGT 116b are formed at the outer periphery of the Si pillar 115 so as to surround the gate insulating layers 119a and 119b, respectively. An $N^+$ region 121a is formed in a surface layer portion of the P-layer substrate 117 connected to the bottom portion of the Si pillar 115. An $N^+$ region 121b is formed within the Si pillar 115 above the $N^+$ region 121a. A $P^+$ region 122a (hereinafter, a semiconductor region containing an acceptor impurity in a high concentration is referred to as a "$P^+$ region") is formed within the Si pillar 115 connected to the $N^+$ region 121b. A $P^+$ region 122b is formed in a top portion of the Si pillar 115. The $N^+$ region 121a is a source of the N-channel SGT 116a, and the $N^+$ region 121b is a drain of the N-channel SGT 116a. The Si pillar 115 located between the $N^+$ regions 121a and 121b is a channel region 123a of the N-channel SGT 116a. The $P^+$ region 122b is a source of the P-channel SGT 116b, and the $P^+$ region 122a is a drain of the P-channel SGT 116b. The Si pillar 115 located between the $P^+$ regions 122a and 122b is a channel region 123b of the P-channel SGT 116b. A ground wiring conductor layer 126a is formed so as to connect to the $N^+$ region 121a. The ground wiring conductor layer 126a is connected to a ground terminal VSS. An output wiring conductor layer 126b is formed so as to connect to the $N^+$ region 121b and the $P^+$ region 122a. The output wiring conductor layer 126b is connected to an output terminal Vo. A power supply wiring conductor layer 126c is formed so as to connect to the $P^+$ region 122b. The power supply wiring conductor layer 126c is connected to a power supply terminal VDD. Input wiring conductor layers 127a and 127b are formed so as to connect to the gate conductor layers 120a and 120b, respectively. The input wiring conductor layers 127a and 127b are each connected to an input terminal Vi.

In the configuration illustrated in FIG. 10, a technique of reliably establishing the connection between the $N^+$ region 121b and the output wiring conductor layer 126b and between the $P^+$ region 122a and the output wiring conductor layer 126b at the side surface of the Si pillar 115 has been a challenge. Furthermore, since the side surface of the Si pillar 115 is processed, it is also necessary to reliably establish the connection between the gate conductor layer 120a and the input wiring conductor layer 127a and between the gate conductor layer 120b and the input wiring conductor layer 127b. The connection of wiring cannot be established at the side surface of the Si pillar 115 by, for example, a reactive ion etching (RIE) method, which is a method of etching in the vertical direction and is used for forming a circuit chip formed by ordinary planar or fin transistors.

SUMMARY OF THE INVENTION

As described above, the SGT-including pillar-shaped semiconductor device illustrated in FIG. 10 requires a technique of reliably and easily establishing, at the side surface of the Si pillar 115, the connection between the $N^+$ region 121b and the output wiring conductor layer 126b and between the $P^+$ region 122a and the output wiring conductor layer 126b and/or the connection between the gate conductor layer 120a and the input wiring conductor layer 127a and between the gate conductor layer 120b and the input wiring conductor layer 127b.

A method for producing a pillar-shaped semiconductor device according to a first aspect of the present invention includes:

a step of forming, on a substrate, a semiconductor pillar that stands in a direction perpendicular to a surface of the substrate;

a step of forming, so as to surround the semiconductor pillar, a first material layer which includes a gate conductor layer or does not include a gate conductor layer, whose outermost layer is surrounded by a first insulating layer, and which is formed of a single layer or a plurality of layers;

a step of forming a second insulating layer which surrounds the first material layer and whose upper surface is positioned lower than a top portion of the semiconductor pillar;

a step of forming an opening by removing a part of the first material layer until a side surface of the semiconductor pillar or a side surface of the gate conductor layer is exposed, in which a lower end of the opening is positioned at the same height as the upper surface of the second insulating layer in the perpendicular direction;

a step of forming a connection material layer which contains a semiconductor atom or a metal atom, which is in contact with the side surface of the semiconductor pillar or the side surface of the gate conductor layer, the side surface being exposed in the opening, and whose outer circumference is located outside an outer circumference of the first material layer in plan view, by a selective deposition method with which a material that constitutes the connection material layer is selectively deposited on the side surface of the semiconductor pillar or the side surface of the gate conductor layer rather than a surface of the first insulating layer and a surface of the second insulating layer; and a step of forming a wiring conductor layer that is in contact with the connection material layer and that extends onto the second insulating layer.

In the method, the connection material layer is formed such that a gap is formed between an upper surface of the connection material layer and an upper surface of the opening.

The method preferably includes a step of forming the connection material layer so as to be in contact with a side surface of an impurity region that is present within the semiconductor pillar and that contains a donor or acceptor impurity.

The method preferably further includes, in the step of forming a connection material layer by the selective deposition method, a step of forming the connection material layer that contains a donor or acceptor impurity or adding the donor or acceptor impurity to the connection material layer; and a step of diffusing the donor or acceptor impurity into the semiconductor pillar by heat treatment.

At least a part of the connection material layer, the part being in contact with the semiconductor pillar, is preferably a semiconductor layer, and the method preferably further includes a step of alloying the semiconductor layer by heat treatment.

One or both of the connection material layer and the wiring conductor layer preferably contain a metal atom, and the method preferably further includes a step of diffusing the metal atom into the semiconductor pillar by heat treatment.

The step of forming a wiring conductor layer preferably includes forming the wiring conductor layer that contains a donor or acceptor impurity, and the method preferably further includes a step of diffusing the donor or acceptor impurity into the inside of the semiconductor pillar by heat treatment.

The step of forming a semiconductor pillar preferably includes forming the semiconductor pillar having therein a third insulating layer that insulates an upper portion and a lower portion of the semiconductor pillar from each other, and the method preferably further includes a step of forming impurity regions that contain a donor or acceptor impurity above and under the third insulating layer and within the semiconductor pillar.

The method preferably includes a step of removing a part of the gate conductor layer that surrounds an outer periphery of the third insulating layer.

A method for producing a pillar-shaped semiconductor device according to a second aspect of the present invention includes:

a step of forming, on a substrate, a semiconductor pillar that stands in a direction perpendicular to a surface of the substrate;

a step of forming, so as to surround the semiconductor pillar, a first material layer which includes a gate conductor layer or does not include a gate conductor layer, whose outermost layer is surrounded by a first insulating layer, and which is formed of a single layer or a plurality of layers;

a step of forming a second insulating layer which surrounds the first material layer and whose upper surface is positioned lower than a top portion of the semiconductor pillar;

a step of forming an opening by removing a part of the first material layer until a side surface of the semiconductor pillar or a side surface of the gate conductor layer is exposed, in which a lower end of the opening is positioned at the same height as the upper surface of the second insulating layer in the perpendicular direction;

a step of forming a connection material layer which contains a semiconductor, which is in contact with the side surface of the semiconductor pillar or the side surface of the gate conductor layer, the side surface being exposed in the opening, and whose outer circumference is located outside an outer circumference of the first material layer in plan view, by a selective deposition method with which a material that constitutes the connection material layer is selectively deposited on the side surface of the semiconductor pillar or the side surface of the gate conductor layer rather than a surface of the first insulating layer and a surface of the second insulating layer; and a step of forming a wiring conductor layer that is in contact with the connection material layer and that extends onto the second insulating layer.

In the method, the connection material layer contains a donor or acceptor impurity and is constituted by a semiconductor atom that is different from a semiconductor atom constituting the semiconductor pillar, and the connection material layer functions as a source or a drain.

The method preferably further includes, between the step of forming an opening and the step of forming a connection material layer, a step of removing a surface layer on the side surface of the semiconductor pillar in the opening.

The method preferably further includes:

a step of forming a third insulating layer which surrounds the first material layer and whose upper surface is positioned lower than a top portion of the semiconductor pillar;

a step of forming a second opening by removing a part of the first material layer until a side surface of the gate conductor layer is exposed, in which a lower end of the second opening is positioned at the same height as an upper surface of the third insulating layer in the perpendicular direction;

a step of forming a second connection material layer which is in contact with the side surface of the gate conductor layer, the side surface being exposed in the second opening, and whose outer circumference is located outside the outer circumference of the first material layer in plan view, by a selective deposition method with which a material that constitutes the second connection material layer is selectively deposited on the side surface of the gate conductor layer rather than a surface of the first insulating layer and a surface of the third insulating layer; and a step of forming a wiring conductor layer that is in contact with the second connection material layer and that extends onto the third insulating layer.

The step of forming a connection material layer by the selective deposition method preferably includes forming, as the connection material layer, a first silicon-germanium layer that contains an acceptor impurity, and the method preferably further includes a step of forming a second silicon-germanium layer that contains an acceptor impurity by the selective deposition method above or under a part of the semiconductor pillar surrounded by the gate conductor layer.

A pillar-shaped semiconductor device according to a third aspect of the present invention includes:
a substrate;
a semiconductor pillar that stands on the substrate in a direction perpendicular to a flat surface of the substrate;
a gate insulating layer that surrounds the semiconductor pillar;
a gate conductor layer that surrounds the gate insulating layer;
a first insulating layer that surrounds the gate conductor layer;
impurity regions that function as a source or a drain and that are present above and under the gate conductor layer in the perpendicular direction and within the semiconductor pillar;
an opening that extends from a side surface of at least one of the impurity regions or a side surface of the gate conductor layer to the first insulating layer in a horizontal direction;
a first conductor layer that contains a first semiconductor atom or a first metal atom, that is in contact with the at least one of the impurity regions or the gate conductor layer, that extends in the opening in the horizontal direction, that has an outer peripheral edge outside the first insulating layer in plan view, that has a gap between an upper surface of the first conductor layer and an upper surface of the opening, and that is in contact with a lower surface of the opening; and
a second conductor layer that contains a second metal atom, that is connected to an outer periphery of the first conductor layer, and that extends in the horizontal direction.

The first conductor layer preferably contains a donor or acceptor impurity, and the at least one of the impurity regions preferably contains the donor or acceptor impurity.

The second conductor layer preferably contains a donor or acceptor impurity, and the at least one of the impurity regions preferably contains the donor or acceptor impurity.

An alloy layer that contains the metal atom is preferably present inside a side surface of the semiconductor pillar that is in contact with the first conductor layer.

The pillar-shaped semiconductor device preferably further includes a second insulating layer that is disposed within the semiconductor pillar and that insulates an upper portion and a lower portion of the semiconductor pillar from each other, and impurity regions that function as a source or a drain are preferably formed above and under the second insulating layer.

The gate conductor layer is preferably separated by a third insulating layer that is disposed adjacent to the second insulating layer in the horizontal direction.

The upper surface of the first conductor layer is preferably disposed apart from a lower end of the first insulating layer and a lower end of the gate insulating layer in the perpendicular direction.

A pillar-shaped semiconductor device according to a fourth aspect of the present invention includes:
a substrate;
a semiconductor pillar that stands on the substrate in a direction perpendicular to a flat surface of the substrate;
a gate insulating layer that surrounds the semiconductor pillar;
a gate conductor layer that surrounds the gate insulating layer;
a first insulating layer that surrounds the gate conductor layer;
a semiconductor layer that is in contact with a side surface of the semiconductor pillar or the gate conductor layer, that extends in a horizontal direction, and that has an outer peripheral edge outside the first insulating layer in plan view; and
a wiring conductor layer that is connected to an outer periphery of the semiconductor layer.

In the pillar-shaped semiconductor device, the semiconductor layer contains a donor or acceptor impurity and is constituted by a semiconductor atom that is different from a semiconductor atom constituting the semiconductor pillar, and the semiconductor layer functions as a source or a drain.

In plan view, an outer circumference of a side surface of the semiconductor pillar, the side surface being in contact with the semiconductor layer, is preferably located inside an outer circumference of a side surface of the semiconductor pillar, the side surface being in contact with the gate insulating layer.

The pillar-shaped semiconductor device preferably further includes:
a first conductor layer that is in contact with the gate conductor layer and that has an outer peripheral edge outside the first insulating layer in plan view; and
a second conductor layer that is in contact with the first conductor layer.

The semiconductor layer is preferably formed of a silicon-germanium layer that contains an acceptor impurity, and the silicon-germanium layer preferably functions as the source or the drain.

According to the aspects of the present invention, in an SGT-including semiconductor device, the connection between a semiconductor region or gate conductor layer present in a central portion of a semiconductor pillar and a wiring metal layer connected to an alloy layer can be reliably established.

BRIEF DESCRIPTION OF THE DRAWINGS

FIG. 1AA and FIGS. 1AB and 1AC are respectively a plan view and sectional structural views of a CMOS inverter circuit for explaining a method for producing an SGT-including semiconductor device according to a first embodiment of the present invention.

FIG. 1BA and FIGS. 1BB and 1BC are respectively a plan view and sectional structural views of the CMOS inverter circuit for explaining the method for producing an SGT-including semiconductor device according to the first embodiment.

FIG. 1GA and FIGS. 1GB and 1GC are respectively a plan view and sectional structural views of the CMOS inverter circuit for explaining the method for producing an SGT-including semiconductor device according to the first embodiment.

FIG. 1HA and FIGS. 1HB and 1HC are respectively a plan view and sectional structural views of the CMOS inverter circuit for explaining the method for producing an SGT-including semiconductor device according to the first embodiment.

FIG. 1IA and FIGS. 1IB and 1IC are respectively a plan view and sectional structural views of the CMOS inverter circuit for explaining the method for producing an SGT-including semiconductor device according to the first embodiment.

FIG. 1JA and FIGS. 1JB and 1JC are respectively a plan view and sectional structural views of the CMOS inverter circuit for explaining the method for producing an SGT-including semiconductor device according to the first embodiment.

FIG. 2CA and FIGS. 2CB and 2CC are respectively a plan view and sectional structural views of the CMOS inverter circuit for explaining the method for producing an SGT-including semiconductor device according to the second embodiment.

FIG. 2DA and FIGS. 2DB and 2DC are respectively a plan view and sectional structural views of the CMOS inverter circuit for explaining the method for producing an SGT-including semiconductor device according to the second embodiment.

FIG. 4AA and FIGS. 4AB and 4AC are respectively a plan view and sectional structural views of a CMOS inverter circuit for explaining a method for producing an SGT-including semiconductor device according to a fourth embodiment of the present invention.

FIG. 4BA and FIGS. 4BB and 4BC are respectively a plan view and sectional structural views of the CMOS inverter circuit for explaining the method for producing an SGT-including semiconductor device according to the fourth embodiment.

FIG. 4CA and FIGS. 4CB and 4CC are respectively a plan view and sectional structural views of the CMOS inverter circuit for explaining the method for producing an SGT-including semiconductor device according to the fourth embodiment.

FIG. 5AA and FIGS. 5AB and 5AC are respectively a plan view and sectional structural views of a CMOS inverter circuit for explaining a method for producing an SGT-including semiconductor device according to a fifth embodiment of the present invention.

DESCRIPTION OF THE PREFERRED EMBODIMENTS

Figure 1C:
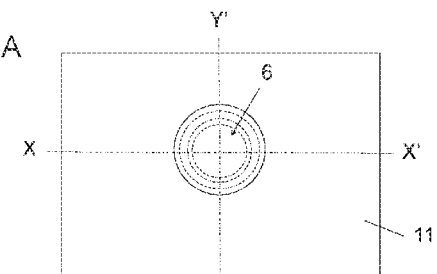
FIG. 1CA and FIGS. 1CB and 1CC are respectively a plan view and sectional structural views of the CMOS inverter circuit for explaining the method for producing an SGT-including semiconductor device according to the first embodiment.
Figure 1C:
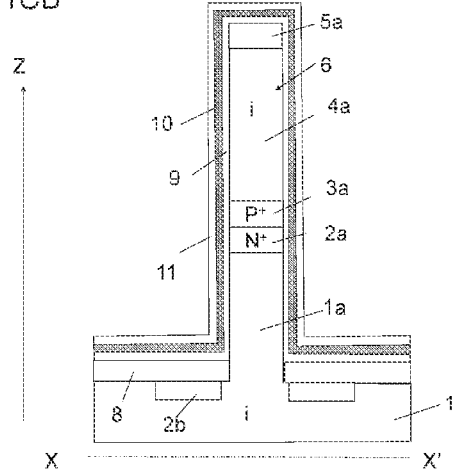
Figure 1C:
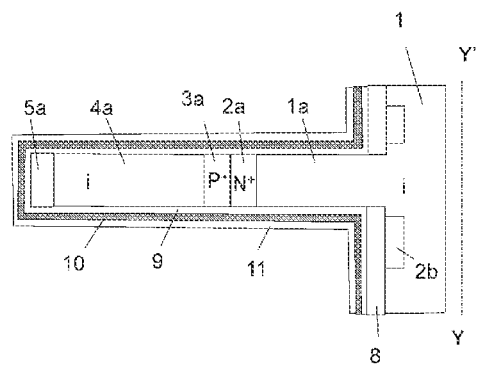

A method for producing an SGT-including pillar-shaped semiconductor device according to an embodiment of the present invention will now be described with reference to the drawings.

First Embodiment

A method for producing an SGT-including CMOS inverter circuit according to a first embodiment of the present invention will now be described with reference to FIGS. 1AA to 1LC.

FIG. 1AA and FIGS. 1AB and 1AC are respectively a plan view and sectional views for explaining a first step in the method for producing an SGT-including CMOS inverter circuit. FIG. 1AA is a plan view, FIG. 1AB is a sectional structural view taken along line X-X' in FIG. 1AA, and FIG. 1AC is a sectional structural view taken along line Y-Y' in FIG. 1AA. This relationship among the figures similarly applies to other figures referred to in the description below.

As illustrated in FIGS. 1AA to 1AC, an $N^+$ layer 2 containing a donor impurity such as arsenic (As) is formed on an i-layer substrate 1 by, for example, an ion implantation method or an epitaxial growth method. Next, a $P^+$ layer 3 containing an acceptor impurity such as boron (B) is formed on the $N^+$ layer 2 by, for example, an ion implantation method or an epitaxial growth method. Subsequently, an i-layer 4 is formed on the $P^+$ layer 3 by, for example, an epitaxial growth method. A $SiO_2$ layer 5 is then formed on the i-layer 4 by, for example, a thermal oxidation method.

Next, as illustrated in FIGS. 1BA to 1BC, the $SiO_2$ layer 5 is etched by using, for example, a lithography method and a reactive ion etching (RIE) method to form a $SiO_2$ layer 5a. Furthermore, the i-layer 4, the $P^+$ layer 3, the $N^+$ layer 2, and the i-layer substrate 1 are etched by a RIE method or the like using the $SiO_2$ layer 5a as a mask to form a Si pillar 6 that includes an i-layer 4a, a $P^+$ region 3a, an $N^+$ region 2a, and an i-layer 1a and that extends in a vertical (up-down) direction. The side surface of the Si pillar 6 forms a substantially right angle with respect to the upper surface of the i-layer substrate 1. The cross-sectional shape of the Si pillar 6 is preferably a round shape as illustrated in FIG. 1BA.

Next, as illustrated in FIGS. 1CA to 1CC, an $N^+$ region 2b is formed in an upper surface layer of the i-layer substrate 1 at the outer periphery of the Si pillar 6 by, for example, an ion implantation method. Subsequently, a $SiO_2$ film (not illustrated) is deposited by, for example, a chemical vapor deposition (CVD) method, the upper surface of the $SiO_2$ film is planarized by, for example, a mechanical chemical polishing (MCP) method, and the $SiO_2$ film is then etched by an etch-back method. As a result, a $SiO_2$ layer 8 is left on the i-layer substrate 1 at the outer periphery of the Si pillar 6. Subsequently, the entire Si pillar 6 and $SiO_2$ layer 8 are covered with a hafnium oxide ($HfO_2$) layer 9 and a titanium nitride (TiN) layer 10 by, for example, an atomic layer deposition (ALD) method. The Si pillar 6 and the entire peripheral area of the Si pillar 6 are then covered with a $SiO_2$ layer 11 by, for example, a CVD method.

Figure 1D:
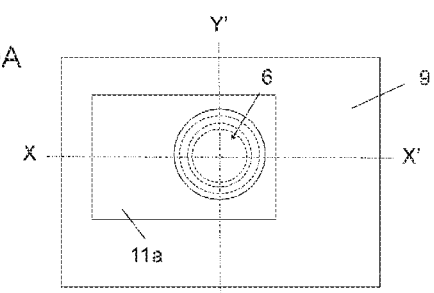
FIG. 1DA and FIGS. 1DB and 1DC are respectively a plan view and sectional structural views of the CMOS inverter circuit for explaining the method for producing an SGT-including semiconductor device according to the first embodiment.
Figure 1D:
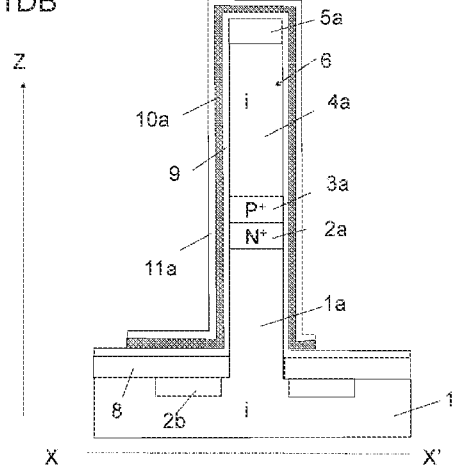
Figure 1D:
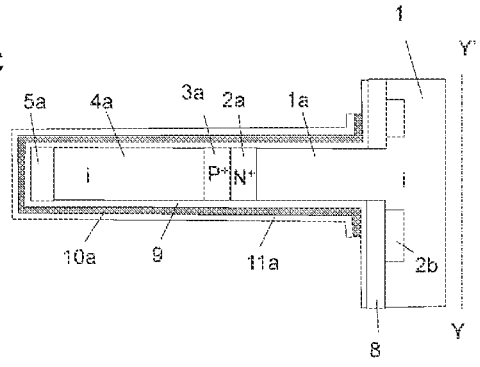

Next, as illustrated in FIGS. 1DA to 1DC, the $SiO_2$ layer 11 and the TiN layer 10 are etched by a RIE method using, as a mask, a resist formed by, for example, a lithography method to form a $SiO_2$ layer 11a and a TiN layer 10a from the upper surface of the Si pillar 6 to the upper surface of the $SiO_2$ layer 8.

Figure 1E:
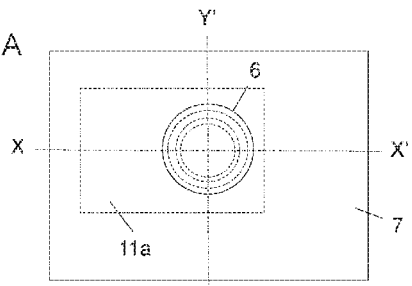
FIG. 1EA and FIGS. 1EB and 1EC are respectively a plan view and sectional structural views of the CMOS inverter circuit for explaining the method for producing an SGT-including semiconductor device according to the first embodiment.
Figure 1E:
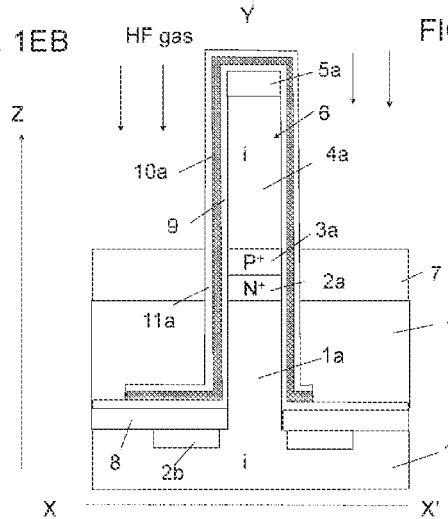
Figure 1E:
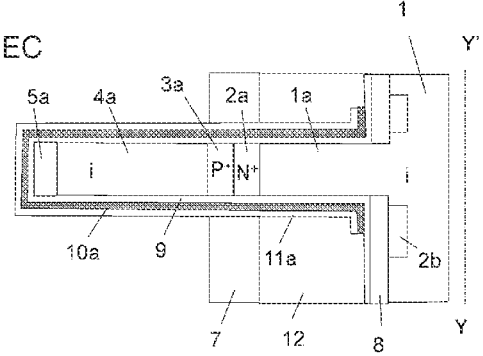

Next, as illustrated in FIGS. 1EA to 1EC, a silicon nitride (SiN) layer 12 is formed at the outer periphery of the Si pillar 6. Here, the SiN layer 12 is formed so that the position of the upper surface thereof is lower than the upper end of the $N^+$ region 2a formed within the Si pillar 6 and equal to or higher than the lower end of the $N^+$ region 2a, for example, at the same height as the lower end of the $N^+$ region 2a. Subsequently, a resist layer 7 is formed on the SiN layer 12. Here, the resist layer 7 is formed so that the position of the upper surface thereof is equal to or lower than the upper end of the $P^+$ region 3a and higher than the lower end of the $P^+$ region 3a, for example, at the same height as the upper end of the $P^+$ region 3a. The resist layer 7 is formed by, for example, applying a resist material over the entire surface and, for example, performing heat treatment at 200° C. so as to increase the fluidity of the resist material and to evenly collect the resist material on the SiN layer 12 on the outside of the Si pillar 6. Subsequently, hydrogen fluoride gas (hereinafter referred to as "HF gas") is supplied to the entire part. Subsequently, for example, a heating environment of 180° C. is produced. As a result, the HF gas is ionized by the moisture contained in the resist layer 7, and hydrogen fluoride ions ($HF_2^+$) (hereinafter referred to as "HF ions") are formed. The HF ions diffuse into the resist layer 7 and etch the $SiO_2$ layer 11a that is in contact with the resist layer 7 (regarding the mechanism of etching here, refer to Tadashi Shibata, Susumu Kohyama, and Hisakazu Iizuka: "A New Field Isolation Technology for High Density MOS LSI", Japanese Journal of Applied Physics, Vol. 18, pp. 263-267 (1979)). In contrast, the $SiO_2$ layer 11a that is not in contact with the resist layer 7 remains substantially unetched. The resist layer 7 is then removed.

Consequently, the $SiO_2$ layer 11a is divided into a $SiO_2$ layer 11b in a region covered with the SiN layer 12 and a $SiO_2$ layer 11c in an upper region of the Si pillar 6. Subsequently, the TiN layer 10a is etched by using the $SiO_2$ layers 11b and 11c as a mask. As a result, the TiN layer 10a is divided into a TiN layer 10b covered with the $SiO_2$ layer 11b in a lower region of the Si pillar 6 and a TiN layer 10c covered with the $SiO_2$ layer 11c in the upper region of the Si pillar 6. Subsequently, the $HfO_2$ layer 9 is etched by using the $SiO_2$ layers 11b and 11c and the TiN layers 10b and 10c as a mask. As a result, the $HfO_2$ layer 9 is divided into a $HfO_2$ layer 9a partly covered with the TiN layer 10b in the lower region of the Si pillar 6 and a $HfO_2$ layer 9b covered with the TiN layer 10c in the upper region of the Si pillar 6. Consequently, an opening 13a in which outer peripheral side surfaces of the $N^+$ region 2a and the $P^+$ region 3a are exposed is formed. Subsequently, exposed portions of the TiN layers 10b and 10c are oxidized to form TiO (titanium oxide) layers 14a and 14b, respectively. A thin $SiO_2$ layer (not illustrated) formed by this oxidation on the outer peripheral side surfaces of the $N^+$ region 2a and the $P^+$ region 3a is then removed. As a result, the configuration illustrated in FIGS. 1FA to 1FC is produced.

Next, as illustrated in FIGS. 1GA to 1GC, a Si layer 15 in contact with the outer peripheral side surfaces of the $N^+$ region 2a and the $P^+$ region 3a and surrounding the opening 13a is formed by a Si selective epitaxial growth method. In the Si selective epitaxial growth method, Si atoms or Si molecules are reached on the planar SiN layer 12 in a chemical vapor deposition (CVD) apparatus using, for example, disilane ($Si_2H_6$) and chlorine ($Cl_2$) as reaction gas. The Si atoms or Si molecules (including both elemental Si and a Si compound) that have reached move on the SiN layer 12, and crystals are grown from the bottom of the $N^+$ region 2a serving as a crystal growth nucleus so as to fill the opening 13a. As a result, the Si layer 15 is formed. This Si selective epitaxial growth is performed until the outer circumferential position of the Si layer 15 projects outward from the outer circumference of the $SiO_2$ layer 11c in plan view.

Next, for example, nickel (Ni) atoms are injected in a direction perpendicular to the upper surface of the i-layer substrate 1 by using, for example, a bias sputtering method to form a Ni layer (not illustrated) on the SiN layer 12 and the Si pillar 6. The bias sputtering method is performed as follows. A substrate metal plate on which the i-layer substrate 1 is disposed and a counter metal plate distant from the substrate metal plate are prepared, a direct-current voltage is applied to the substrate metal plate, and a radiofrequency (RF) voltage is applied between the two parallel metal plates to sputter atoms of the material of the counter metal plate and to deposit the atoms on the i-layer substrate 1. The upper surface of this Ni layer is preferably positioned higher than the upper surface of the Si layer 15. Here, the Ni atoms are injected in a direction perpendicular to the upper surface of the i-layer substrate 1. Since the side surface of the Si pillar 6 forms a substantially right angle with respect to the upper surface of the i-layer substrate 1, deposition of the Ni layer on the side surface of the Si pillar 6 is prevented by controlling the bias voltage applied between the counter metal plate of a bias sputtering apparatus and the substrate metal plate on which the i-layer substrate 1 is disposed (regarding the basic control method, refer to C. Y. Ting, V. J. Vivalda, and H. G. Schaefer: "Study of planarized sputter-deposited $SiO_2$," J. Vac. Sci. Technol, 15(3), May/Jun (1978)). Subsequently, as illustrated in FIGS. 1HA to 1HC, a Ni layer 16 surrounding the Si layer 15 in plan view is formed by, for example, a lithography method and RIE etching.

Next, as illustrated in FIGS. 1IA to 1IC, heat treatment is performed at, for example, 550° C. to diffuse Ni atoms in the Ni layer 16 into the Si layer 15. Thus, the Si layer 15 is converted into a silicide to form a NiSi layer 15a. In addition, the impurity in the $N^+$ region 2b is diffused into the peripheral i-layer substrate 1 by this heat treatment to form an $N^+$ region 2c.

Next, as illustrated in FIGS. 1JA to 1JC, a SiN layer 20 is formed as in the formation of the SiN layer 12 so that the upper surface thereof is positioned above the $P^+$ region 3a and below the $SiO_2$ layer 5a. Subsequently, an opening 13b is formed at the outer periphery of the TiN layer 10c by the same method as that used for forming the opening 13a. Subsequently, a Si layer (not illustrated) that is in contact with the TiN layer 10c and that fills the opening 13b is formed by a Si selective epitaxial growth method as in the formation of the Si layer 15. Subsequently, a Ni layer (not illustrated) is formed by injecting Ni atoms in a direction perpendicular to the upper surface of the i-layer substrate 1 by, for example, a bias sputtering method as in the formation of the NiSi layer 15a. Subsequently, a Ni layer 22 is formed by, for example, a lithography method and a RIE method as in the formation of the Ni layer 16. The Si layer is then converted into a silicide by, for example, heat treatment at 550° C. to form a NiSi layer 21.

Figure 1F:
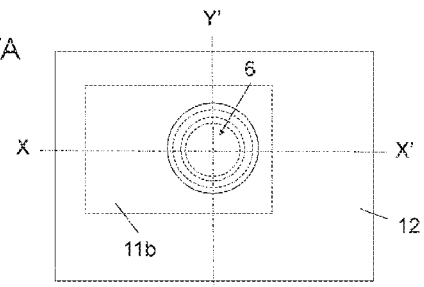
FIG. 1FA and FIGS. 1FB and 1FC are respectively a plan view and sectional structural views of the CMOS inverter circuit for explaining the method for producing an SGT-including semiconductor device according to the first embodiment.
Figure 1F:
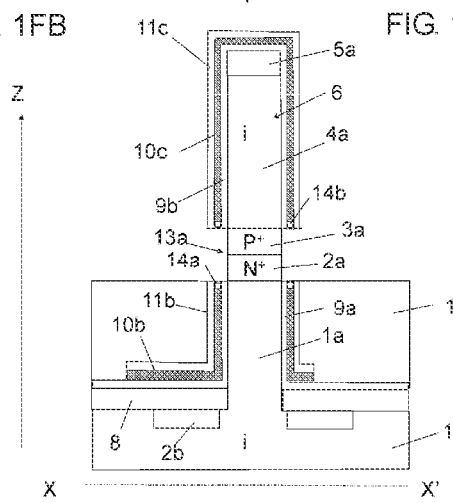
Figure 1F:
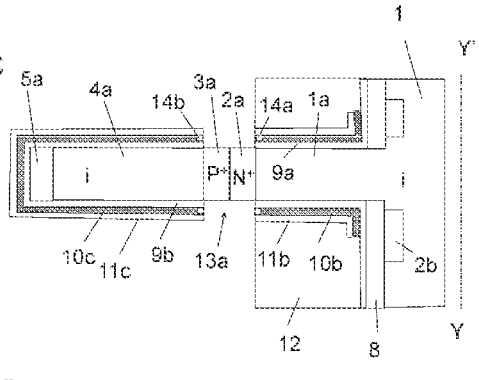
Figure 1K:
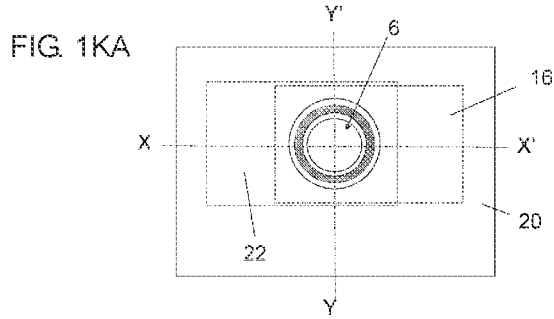
FIG. 1KA and FIGS. 1KB and 1KC are respectively a plan view and sectional structural views of the CMOS inverter circuit for explaining the method for producing an SGT-including semiconductor device according to the first embodiment.
Figure 1K:
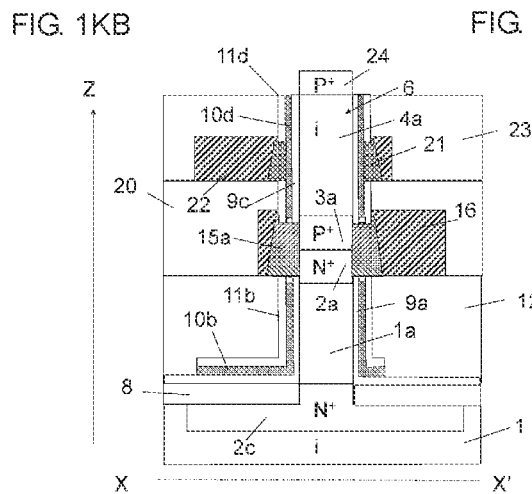
Figure 1K:
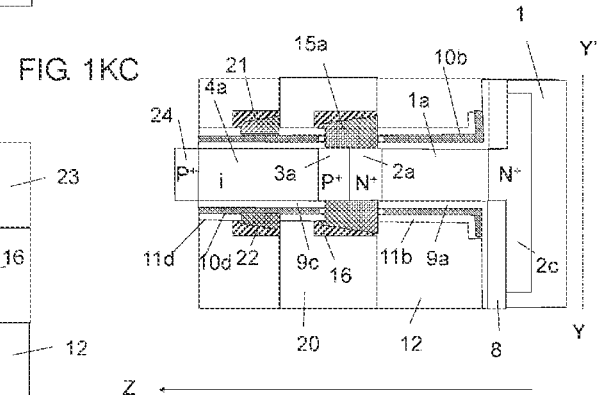

Next, as illustrated in FIGS. 1KA to 1KC, a $SiO_2$ layer 23 is formed at the outer periphery of the Si pillar 6 by, for example, a CVD method and an etch-back method so that the position of the upper surface thereof is higher than the surface of the Ni layer 22 and lower than the top portion of the Si pillar 6. Subsequently, the $SiO_2$ layer 11c, the TiN layer 10c, and the $HfO_2$ layer 9b are etched by using the $SiO_2$ layer 23 as a mask to form a $SiO_2$ layer 11d, a TiN layer 10d, and a $HfO_2$ layer 9c. Next, a $P^+$ region 24 is formed in the top portion of the Si pillar 6 by, for example, a boron (B) ion implantation method by using the $SiO_2$ layers 23 and 11d, the TiN layer 10d, and the $HfO_2$ layer 9c as a mask.

Figure 1L:
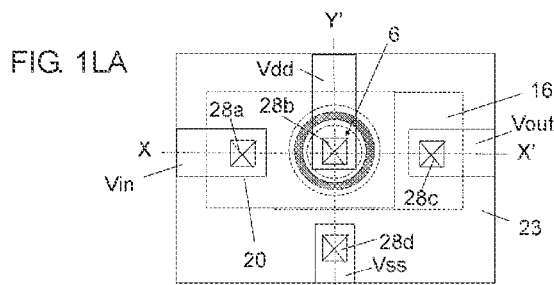
FIG. 1LA and FIGS. 1LB and 1LC are respectively a plan view and sectional structural views of the CMOS inverter circuit for explaining the method for producing an SGT-including semiconductor device according to the first embodiment.
Figure 1L:
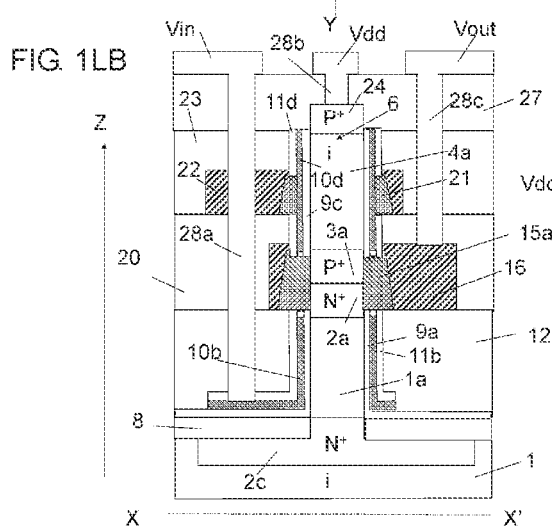
Figure 1L:
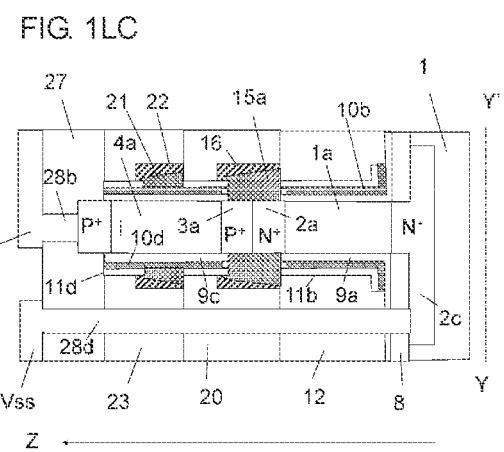

Next, as illustrated in FIGS. 1LA to 1LC, a $SiO_2$ layer 27 is formed over the entirety by, for example, a CVD method. Subsequently, for example, a lithography method and a RIE method are used to form a contact hole 28a on the TiN layer 10b so as to extend through the Ni layer 22, a contact hole 28b on the top portion of the Si pillar 6, a contact hole 28c on the Ni layer 16, and a contact hole 28d on the $N^+$ region 2c. Next, an input wiring metal layer Vin that is electrically connected to the Ni layer 22 and the TiN layer 10b through the contact hole 28a is formed. A power supply wiring metal layer Vdd that is electrically connected to the $P^+$ region 24 in the top portion of the Si pillar 6 through the contact hole 28b is formed. An output wiring metal layer Vout that is electrically connected to the Ni layer 16 through the contact hole 28c is formed. A ground wiring metal layer Vss that is electrically connected to the $N^+$ region 2c through the contact hole 28d is formed.

The production method described above provides a CMOS inverter circuit that includes an N-channel SGT and a P-channel SGT, in which the N-channel SGT includes a channel formed of the i-layer 1a in the lower portion of the Si pillar 6, a gate insulating layer formed of the $HfO_2$ layer 9a surrounding the outer periphery of the i-layer 1a, a gate conductor layer formed of the TiN layer 10b surrounding the outer periphery of the $HfO_2$ layer 9a, a source formed of the $N^+$ region 2c below the i-layer 1a, and a drain formed of the $N^+$ region 2a on the i-layer 1a, and the P-channel SGT includes a channel formed of the i-layer 4a in the upper portion of the Si pillar 6, a gate insulating layer formed of the $HfO_2$ layer 9c surrounding the outer periphery of the i-layer 4a, a gate conductor layer formed of the TiN layer 10d surrounding the outer periphery of the $HfO_2$ layer 9c, a drain formed of the $P^+$ region 3a below the i-layer 4a, and a source formed of the $P^+$ region 24 on the i-layer 4a.

The method for producing a CMOS inverter circuit according to the first embodiment has the following advantages.

Figure 10:
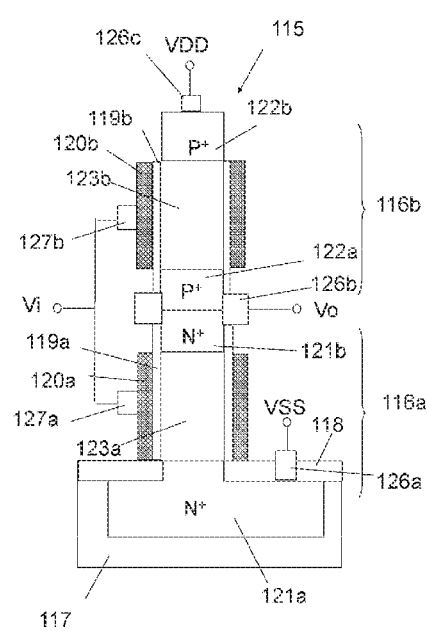
FIG. 10 is a schematic structural view of a CMOS inverter circuit in which an N-channel SGT is formed in a lower portion and a P-channel SGT is formed in an upper portion of a single Si pillar according to an example of the related art.

1. In the method in the related art illustrated in FIG. 10, it is difficult to establish the connection between the $N^+$ region 121b and the output wiring conductor layer 126b and between the $P^+$ region 122a and the output wiring conductor layer 126b from the side surface of the Si pillar 115. In contrast, in the present embodiment, the opening 13a is formed at the outer periphery of the Si pillar 6, and the Si layer 15 is then formed by a Si selective epitaxial growth method so as to be brought into contact with the $N^+$ region 2a and the $P^+$ region 3a and to fill the opening 13a and so that the outer circumference of the Si layer 15 is located outside the outer circumference of the $SiO_2$ layer 11c in plan view. This enables the connection between the Si layer 15 and the Ni layer 16 formed by Ni atoms injected in a direction perpendicular to the surface of the SiN layer 12. In addition, the Si layer 15 is converted into a silicide by heat treatment to form the NiSi layer 15a, thereby easily establishing the connection between the $N^+$ region 2a and the Ni layer 16, which is a wiring conductor layer, and between the $P^+$ region 3a and the Ni layer 16.

2. Similarly, a Si layer (not illustrated) is formed by a Si selective epitaxial growth method, in a state where the Si layer is connected to the TiN layer 10d, so as to fill the opening 13b and so that the outer circumference of the Si layer is located outside the outer circumference of the $SiO_2$ layer 11c in plan view, thereby easily establishing the connection between the TiN layer 10c and the Ni layer 22 serving as a wiring conductor layer with the NiSi layer 21, which has been converted into a silicide, therebetween.

3. By further increasing the time of the heat treatment for forming the NiSi layer 15a, silicidation is caused to proceed from the side surfaces of the $N^+$ region 2a and the $P^+$ region 3a to the inside to form a NiSi layer (not illustrated) inside the Si pillar 6. Thus, the connection resistance between the Ni layer 16, which is a wiring conductor layer, and the $N^+$ region 2a and between the Ni layer 16 and the $P^+$ region 3a can be further reduced.

Second Embodiment

Figure 2A:
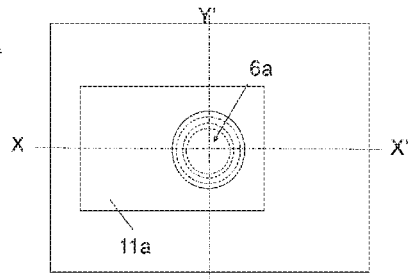
FIG. 2AA and FIGS. 2AB and 2AC are respectively a plan view and sectional structural views of a CMOS inverter circuit for explaining a method for producing an SGT-including semiconductor device according to a second embodiment of the present invention.
Figure 2A:
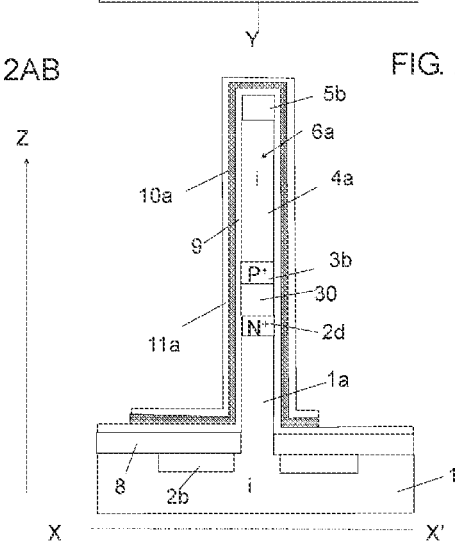
Figure 2A:
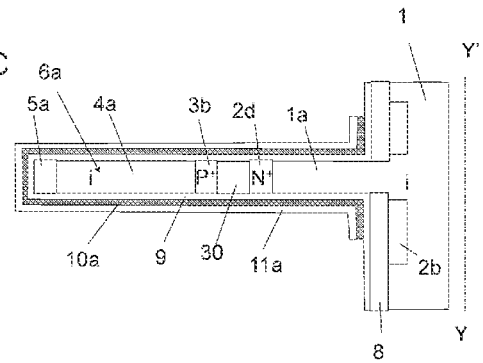

A method for producing an SGT-including CMOS inverter circuit according to a second embodiment of the present invention will now be described with reference to FIGS. 2AA to 2EC. The circuit of the second embodiment is produced by the same steps as those illustrated in FIGS. 1AA to 1LC in the first embodiment except for structural differences described below.

In the step described with reference to FIGS. 1AA to 1AC, a substrate in which a $SiO_2$ layer (not illustrated) is disposed between an $N^+$ layer 2 and a $P^+$ layer 3 is prepared. Subsequently, the steps described with reference to FIGS. 1BA to 1DC are performed. As a result, as illustrated in FIGS. 2AA to 2AC, from the bottom, an $N^+$ region 2d, a $SiO_2$ layer 30, and a $P^+$ region 3b are formed between an i-layer 1a in a lower portion of a Si pillar 6a and an i-layer 4a in an upper portion of the Si pillar 6a. A $SiO_2$ layer 5b is disposed on the top portion of the Si pillar 6a. Subsequently, an $N^+$ region 2b is formed in a surface layer of an i-layer substrate 1 at the outer periphery of the Si pillar 6a. Subsequently, a $SiO_2$ layer 8 is formed on the i-layer substrate 1 at the outer periphery of the Si pillar 6a. Subsequently, a $HfO_2$ layer 9, a TiN layer 10a, and a $SiO_2$ layer 11a that cover the entire Si pillar 6a and that extend to an upper surface of the $SiO_2$ layer 8 are formed.

Figure 2B:
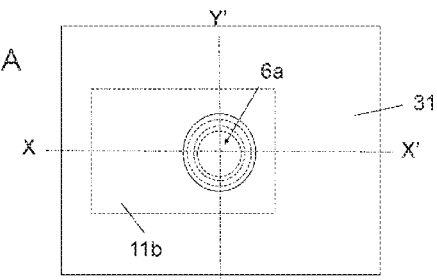
FIG. 2BA and FIGS. 2BB and 2BC are respectively a plan view and sectional structural views of the CMOS inverter circuit for explaining the method for producing an SGT-including semiconductor device according to the second embodiment.
Figure 2B:
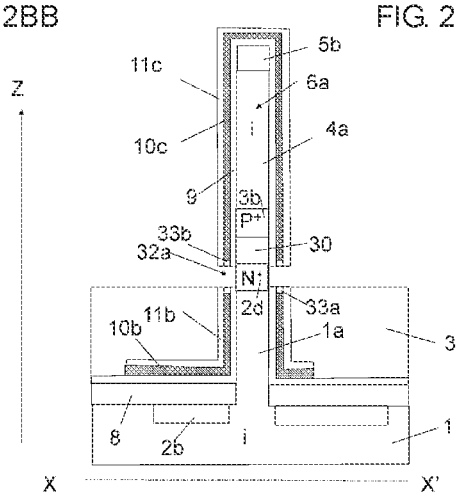
Figure 2B:
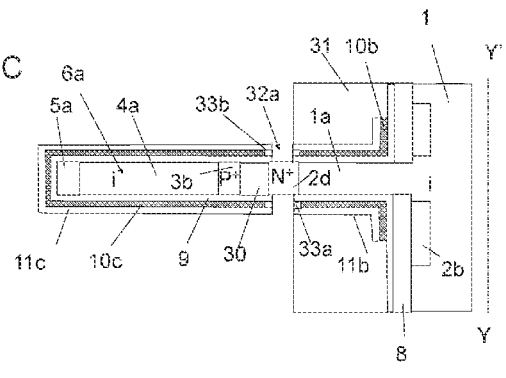

Next, as illustrated in FIGS. 2BA to 2BC, a SiN layer 31 is formed so that the position of the surface thereof is at the same height as the lower end of the $N^+$ region 2d. Subsequently, a resist layer (not illustrated) is formed so that the position of the surface thereof is at the same height as the upper end of the $N^+$ region 2d. Next, as illustrated in FIGS. 2BA to 2BC, an opening 32a in which the side surface of the $N^+$ region 2d is exposed is formed through the same step as the step illustrated in FIGS. 1FA to 1FC. Subsequently, exposed portions of TiN layers 10b and 10c are oxidized to form TiO layers 33a and 33b, respectively.

Next, as illustrated in FIGS. 2CA to 2CC, a Si layer (not illustrated) is formed by a Si selective epitaxial growth method as in the steps illustrated in FIGS. 1GA to 1HC so as to be in contact with the side surface of the $N^+$ region 2d and to fill the opening 32a and so that the outer circumference of the Si layer is located outside the outer circumference of the $SiO_2$ layer 11c in plan view. Subsequently, a NiSi layer 35 formed by silicidation of the Si layer and a Ni layer 36 connected to the NiSi layer 35 are formed by sputtering deposition of Ni, a lithography method, and heat treatment as in the step illustrated in FIGS. 1HA to 1HC.

Next, as illustrated in FIGS. 2DA to 2DC, a SiN layer 38 which surrounds the outer periphery of the $SiO_2$ layer 11c and whose upper surface is positioned higher than the Ni layer 36 is formed. Subsequently, an opening 32b in which the side surface of the $P^+$ region 3b is exposed is formed through the same step as the step illustrated in FIGS. 1FA to 1FC. Subsequently, exposed portions of TiN layers 10d and 10e are oxidized to form TiO layers 33d and 33c, respectively. Subsequently, a Si layer (not illustrated) is formed by a Si selective epitaxial growth method as in the steps illustrated in FIGS. 1GA to 1HC so as to be in contact with the side surface of the $P^+$ region 3b and to fill the opening 32b and so that the outer circumference of the Si layer is located outside the outer circumference of the $SiO_2$ layer 11c in plan view. Subsequently, a NiSi layer 39 formed by silicidation of the Si layer and a Ni layer 40 connected to the NiSi layer 39 are formed by sputtering deposition of Ni, a lithography method, and heat treatment as in the step illustrated in FIGS. 1HA to 1HC. The Ni layer 40 is formed so as to extend in a direction opposite to a direction in which the lower Ni layer 36 extends.

Figure 2E:
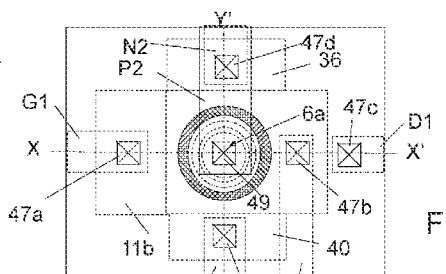
FIG. 2EA and FIGS. 2EB and 2EC are respectively a plan view and sectional structural views of the CMOS inverter circuit for explaining the method for producing an SGT-including semiconductor device according to the second embodiment.
Figure 2E:
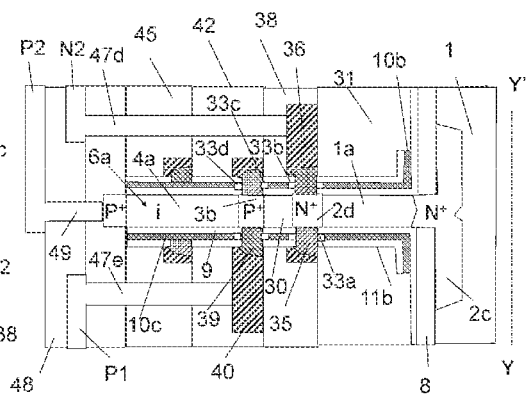
Figure 2E:
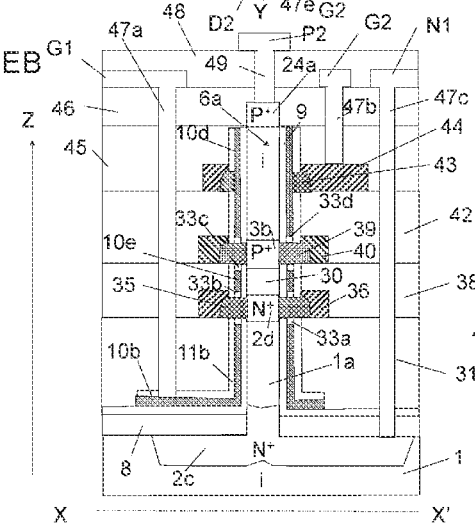

Next, as illustrated in FIGS. 2EA to 2EC, a $SiO_2$ layer 45 is formed over the entirety by, for example, a CVD method and an etch-back method, and a $P^+$ region 24a is formed in the top portion of the Si pillar 6a as in FIGS. 1KA to 1KC. Subsequently, as in FIGS. 1LA to 1LC, a $SiO_2$ layer 46 is formed over the entirety by, for example, a CVD method, and subsequently, for example, a lithography method and a RIE method are used to form a contact hole 47a on the TiN layer 10b, a contact hole 47b on a Ni layer 44, a contact hole 47c on the $N^+$ region 2c, a contact hole 47d on the Ni layer 36, and a contact hole 47e on the Ni layer 40. Next, a gate wiring metal layer G1 that is electrically connected to the TiN layer 10b through the contact hole 47a is formed. A gate wiring metal layer G2 that is electrically connected to the Ni layer 44 through the contact hole 47b is formed. A source or drain wiring metal layer N1 that is electrically connected to the $N^+$ region 2c through the contact hole 47c is formed. A source or drain wiring metal layer N2 that is electrically connected to the $N^+$ region 2d through the contact hole 47d is formed. A source or drain wiring metal layer P1 that is electrically connected to the $P^+$ region 3b through the contact hole 47e is formed. A $SiO_2$ layer 48 is formed so as to cover the entirety of the Si pillar 6a, and a contact hole 49 is formed on the $P^+$ region 24a. A source or drain wiring metal layer P2 that is electrically connected to the $P^+$ region 24a in the top portion of the Si pillar 6a through the contact hole 49 is formed. As a result, a circuit including two SGTs is formed on the i-layer substrate 1.

The method for producing a CMOS inverter circuit according to the second embodiment has the following advantages.

1. In the present embodiment, the N⁺ region 2d and the P⁺ region 3b are formed to be electrically independent from each other by applying the same production method as that in the first embodiment to the N⁺ region 2d and the P⁺ region 3b which are separated by the SiO₂ layer 30. As a result, the two SGTs formed in the upper and lower portions of the Si pillar 6a are electrically independent from each other. Therefore, for example, when the source or drain wiring metal layers P1 and N2 are connected to each other, a CMOS inverter circuit is formed as in the first embodiment. Furthermore, another circuit can be freely formed by changing the connection.

2. As illustrated in FIGS. 2DA to 2DC, the Ni layers 36 and 40 that are connected to the N⁺ region 2d and the P⁺ region 3b, respectively, can be independently formed. In addition, the Ni layers 36 and 40 can be formed so as to reduce a part where the Ni layers 36 and 40 overlap with each other in plan view. As a result, the coupling capacitance between the Ni layers 36 and 40, which are wiring conductor layers connected to the N⁺ region 2d and the P⁺ region 3b, respectively, can be reduced.

3. In the present embodiment, Si layers that are connected to the N⁺ region 2d and the P⁺ region 3b are independently formed. Accordingly, in the NiSi layer 35 connected to the N⁺ region 2d, a Si layer in which a donor impurity is incorporated can be formed by a Si selective epitaxial growth method or an ion implantation method. Similarly, in the NiSi layer 39 connected to the P⁺ region 3b, a Si layer in which an acceptor impurity is incorporated can be formed by a Si selective epitaxial growth method or an ion implantation method. The donor impurity and the acceptor impurity are diffused by the subsequent heat treatment into the N⁺ region 2d and the P⁺ region 3b, respectively, from the corresponding Si layer together with the formation of the NiSi layers 35 and 39. As a result, the impurity concentrations of the N⁺ region 2d and the P⁺ region 3b can be further increased. Thus, the junction resistance in the N⁺ region 2d and the P⁺ region 3b is reduced to realize an increase in the speed of the circuit.

4. In the present embodiment, Si layers connected to the N⁺ region 2d and the P⁺ region 3b and containing a donor impurity and an acceptor impurity can be independently formed. The donor and acceptor impurities contained at high concentrations can sufficiently reduce the resistances of the Si layers. Accordingly, by using, for example, tungsten (W) instead of the Ni layers 36 and 40, the connection between the N⁺ region 2d and a W layer and between the P⁺ region 3b and a W layer can be established without performing silicidation of the entire Si layers. The use of these Si layers containing donor and acceptor impurities enables the conductor material used for the wiring conductor layers to be selected in consideration of, for example, the ease of production and the realization of high performance.

Third Embodiment

A method for producing an SGT-including CMOS inverter circuit according to a third embodiment of the present invention will now be described with reference to FIGS. 3AA to 3CC. A CMOS inverter circuit of the third embodiment is produced by the same steps as those illustrated in FIGS. 1AA to 1LC in the first embodiment except for structural differences described below.

Figure 3A:
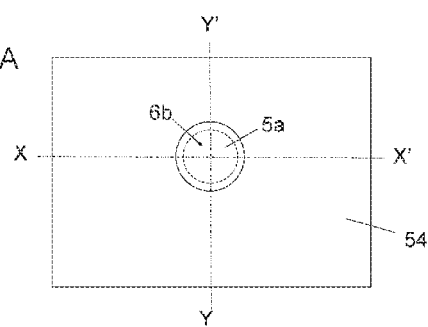
FIG. 3AA and FIGS. 3AB and 3AC are respectively a plan view and sectional structural views of a CMOS inverter circuit for explaining a method for producing an SGT-including semiconductor device according to a third embodiment of the present invention.
Figure 3A:
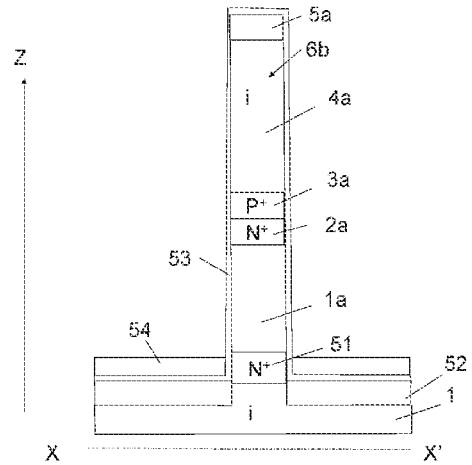
Figure 3A:
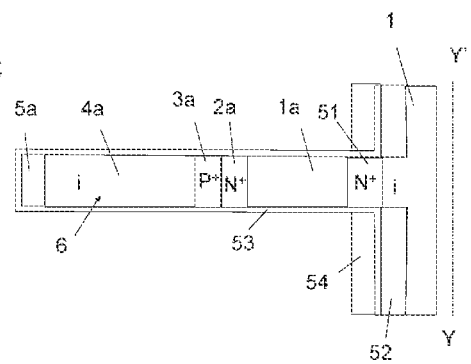

As illustrated in FIGS. 3AA to 3AC, a Si pillar 6b having, from the bottom, an N⁺ region 51, an i-layer 1a, an N⁺ region 2a, a P⁺ region 3a, and an i-layer 4a, and a SiO₂ layer 5a in a top portion thereof is formed on an i-layer substrate 1. The N⁺ region 51 is preferably positioned slightly higher than a bottommost portion of the Si pillar 6b. Subsequently, a SiN layer 52 is formed at the outer periphery of the Si pillar 6b. Subsequently, a SiO₂ layer 53 is formed so as to cover the Si pillar 6b and the SiN layer 52. Subsequently, a resist layer 54 whose upper surface is positioned at the upper surface of the N⁺ region 51 is formed.

Figure 3B:
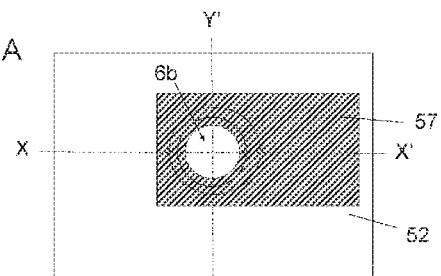
FIG. 3BA and FIGS. 3BB and 3BC are respectively a plan view and sectional structural views of the CMOS inverter circuit for explaining the method for producing an SGT-including semiconductor device according to the third embodiment.
Figure 3B:
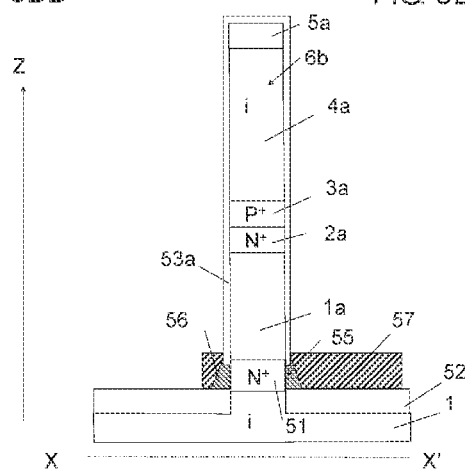
Figure 3B:
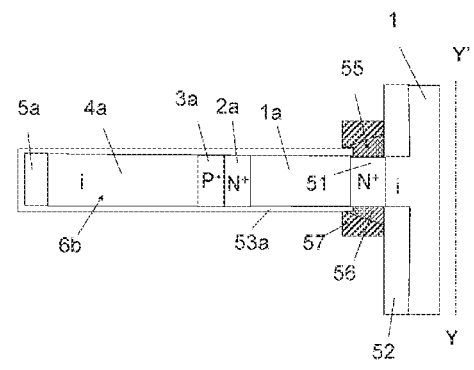

Next, as illustrated in FIGS. 3BA to 3BC, HF gas is supplied to the resist layer 54, and the SiO₂ layer 53 that is in contact with the resist layer 54 is etched by HF ions contained in the resist layer 54 to form an opening 55. The resist layer 54 is then removed. Subsequently, a Si layer which is in contact with the side surface of the N⁺ region 51, which fills the opening 55, and whose outer circumference is located outside a SiO₂ layer 53a in plan view is formed by a Si selective epitaxial growth method. Subsequently, a Ni layer 57 whose upper surface is positioned higher than the upper surface of this Si layer and which is in contact with the Si layer is formed by, for example, a Ni sputtering method, a lithography method, and a RIE etching method. Subsequently, the Si layer is converted into a silicide by heat treatment to form a NiSi layer 56.

Figure 3C:
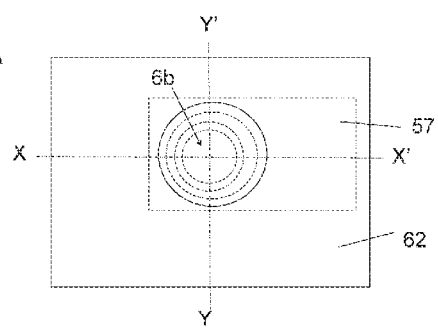
FIG. 3CA and FIGS. 3CB and 3CC are respectively a plan view and sectional structural views of the CMOS inverter circuit for explaining the method for producing an SGT-including semiconductor device according to the third embodiment.
Figure 3C:
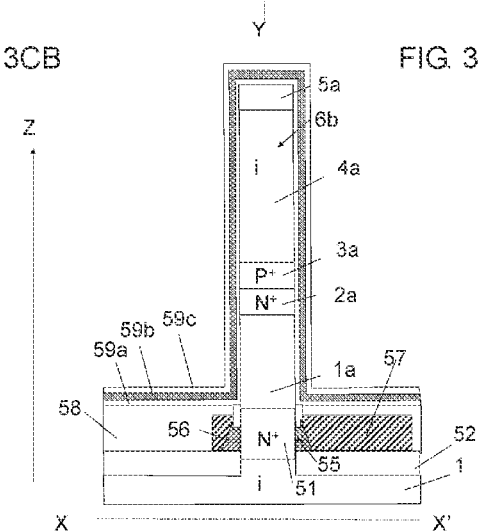
Figure 3C:
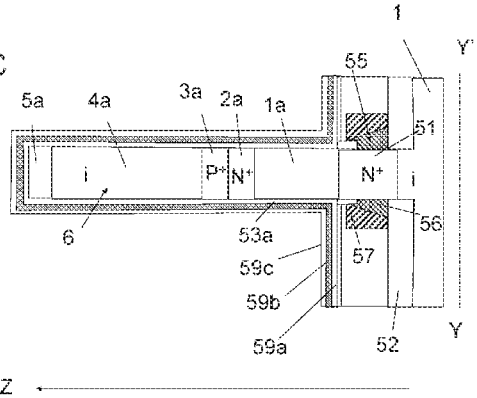

Next, as illustrated in FIGS. 3CA to 3CC, a Si nitride oxide (SiNO) layer 58 is formed so that the upper surface thereof is positioned higher than the upper surface of the Ni layer 57. Subsequently, a HfO₂ layer 59a, a TiN layer 59b, and a SiO₂ layer 59c are formed by, for example, an ALD method so as to cover the entirety. Subsequently, the same steps as those illustrated in FIGS. 1DA to 1LC are performed to thereby form a CMOS inverter circuit having SGTs on the i-layer substrate 1.

The method for producing a CMOS inverter circuit according to the third embodiment has the following advantage.

1. In the description of the first embodiment, the N⁺ region 2c in a surface layer of the i-layer substrate 1, the surface layer being connected from the bottom portion of the Si pillar 6, is electrically connected to the ground wiring metal layer Vss. In this case, the resistance of the N⁺ region 2c in the surface layer of the i-layer substrate 1, the surface layer being connected from the bottom portion of the Si pillar 6, may result in a decrease in circuit performance such as the operation speed. In contrast, in the present embodiment, an N⁺ region is not present in a surface layer of the i-layer substrate 1, the surface layer being connected from the bottom portion of the Si pillar 6, and the N⁺ region 51 is connected directly to the NiSi layer 56 and the Ni layer 57, which have a low resistance. Accordingly, the decrease in circuit performance as in the case of the first embodiment can be prevented.

Fourth Embodiment

A formation of an SGT-including CMOS inverter circuit according to a fourth embodiment of the present invention will now be described with reference to FIGS. 4AA to 4CC. The formation of the circuit of the fourth embodiment is conducted by the same steps as those in the second embodiment except for structural differences described below.

In the step described with reference to FIGS. 1AA to 1AC, a substrate is prepared in which a region between the N⁺ layer 2 and the P⁺ layer 3 is omitted and a SiO₂ layer (not illustrated) is disposed between regions where the N⁺ layer 2 and the P⁺ layer 3 are to be originally formed. Subsequently, the steps described with reference to FIGS. 1BA to 1DC are performed. As a result, as illustrated in FIGS. 4AA to 4AC, a structure that is the same as the structure illustrated in FIGS. 2BA to 2BC except that the P⁺ region 3b and the N⁺ region 2d that are present above and under the SiO₂ layer 30 are not present is formed. A Si surface is exposed at the side surface of a Si pillar 6a in an opening 32a.

Next, as illustrated in FIGS. 4BA to 4BC, a Si layer (not illustrated) containing a donor impurity is formed by a Si selective epitaxial growth method so as to be in contact with the side surface of the Si pillar 6a and to fill the opening 32a and so that the outer circumference of the Si layer is located outside the outer circumference of a SiO₂ layer 11c in plan view, as in the steps illustrated in FIGS. 1GA to 1HC. Subsequently, a Ni layer 36a is formed so as to surround the Si layer. Subsequently, heat treatment is performed to convert the Si layer into a silicide, thereby forming a NiSi layer 35a, and to simultaneously diffuse the donor impurity in the Si layer into the Si pillar 6a, thereby forming an N⁺ region 2A within the Si pillar 6a.

Next, as illustrated in FIGS. 4CA to 4CC, a Si layer (not illustrated) containing an acceptor impurity is formed by a Si selective epitaxial growth method as in the step illustrated in FIGS. 2DA to 2DC so as to be in contact with the side surface of the Si pillar 6a and to fill an opening 32b and so that the outer circumference of the Si layer is located outside the outer circumference of the SiO₂ layer 11c in plan view. Subsequently, heat treatment is performed to convert the Si layer into a silicide, thereby forming a NiSi layer 39a, and to simultaneously diffuse the acceptor impurity in the Si layer into the Si pillar 6a, thereby forming a P⁺ region 3A within the Si pillar 6a. The heat treatment for forming the N⁺ region 2A may be simultaneously performed when the heat treatment for forming the P⁺ region 3A is performed. Subsequently, the step described with reference to FIGS. 2EA to 2EC is performed. Thus, an SGT-including circuit that is the same as that in the second embodiment can be formed.

The method for producing a CMOS inverter circuit according to the fourth embodiment has the following advantage.

1. In the first embodiment, the N⁺ layer 2 containing a donor impurity such as arsenic (As) is formed on the i-layer substrate 1 by an ion implantation method or an epitaxial growth method, and subsequently, the P⁺ layer 3 containing an acceptor impurity such as boron (B) is formed on the N⁺ layer 2 by an ion implantation method or an epitaxial growth method. Subsequently, the i-layer 4 is formed on the P⁺ layer 3 by an epitaxial growth method. In contrast, in the present embodiment, it is not necessary to employ an ion implantation method or an epitaxial growth method for forming the N⁺ region 2A and the P⁺ region 3A. Therefore, the production method is simplified, which leads to a reduction in the production cost.

Fifth Embodiment

A formation of an SGT-including CMOS inverter circuit according to a fifth embodiment of the present invention will now be described with reference to FIGS. 5AA to 5BC. The formation of the circuit of the fifth embodiment is conducted by the same steps as those in the second embodiment except for structural differences described below.

As illustrated in FIGS. 5AA to 5AC, an opening 32a is formed in the side surface of an N⁺ region 2b by performing the same steps as the steps described with reference to FIGS. 2AA to 2BC. Subsequently, a Si layer 60 containing a donor impurity is formed by a Si selective epitaxial growth method so as to be in contact with the side surface of a Si pillar 6a and to fill the opening 32a and so that the outer circumference of the Si layer 60 is located outside the outer circumference of a SiO₂ layer 11c in plan view. Subsequently, a poly-Si layer 61 containing a donor impurity and having a Ni layer 62 thereon is formed so as to surround the Si layer 60.

Figure 5B:
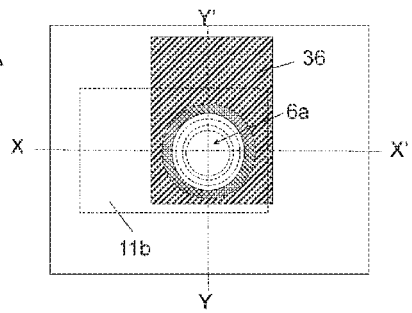
FIG. 5BA and FIGS. 5BB and 5BC are respectively a plan view and sectional structural views of the CMOS inverter circuit for explaining the method for producing an SGT-including semiconductor device according to the fifth embodiment.
Figure 5B:
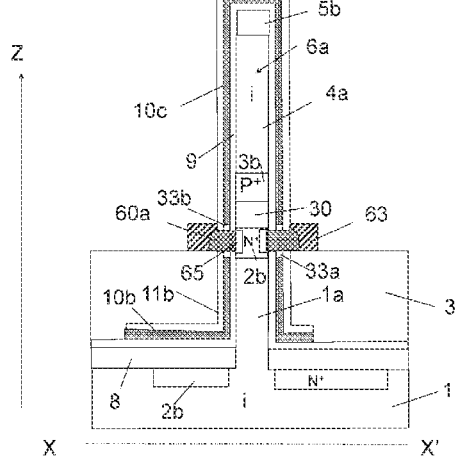
Figure 5B:
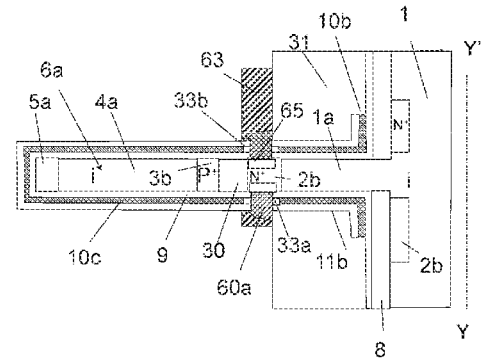

Next, as illustrated in FIGS. 5BA to 5BC, the poly-Si layer 61 and Si layer 60 that contain the donor impurity are converted into a silicide by heat treatment to form NiSi layers 63 and 60a, respectively. In this case, a NiSi layer 65 is formed in the side surface of the N⁺ region 2b. Subsequently, the steps described with reference to FIGS. 2DA to 2EC are performed. Thus, an SGT-including circuit that is the same as that in the second embodiment can be formed.

The method for producing a CMOS inverter circuit according to the fifth embodiment has the following advantage.

1. In the present embodiment, since a donor impurity is contained in both the poly-Si layer 61 and the Si layer 60, the effect of pushing out the donor impurity into the N⁺ region 2b, the effect being achieved by converting the poly-Si layer 61 and the Si layer 60 into a silicide by heat treatment, is high, and the donor impurity can be contained in the N⁺ region 2b in a large amount (regarding the impurity push-out effect due to silicidation, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). As a result, the resistance of the N⁺ region 2b is further reduced.

Sixth Embodiment

Figure 6A:
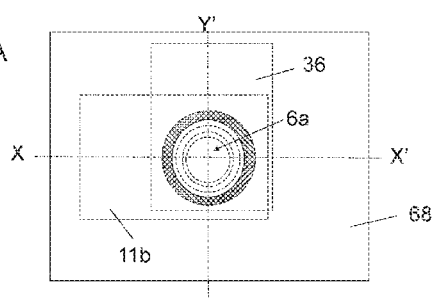
FIG. 6AA and FIGS. 6AB and 6AC are respectively a plan view and sectional structural views of a CMOS inverter circuit for explaining a method for producing an SGT-including semiconductor device according to a sixth embodiment of the present invention.
Figure 6A:
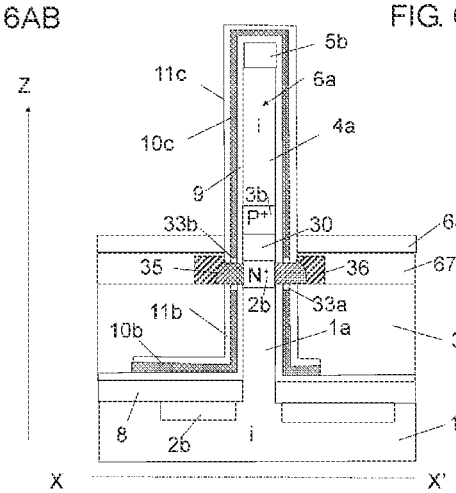
Figure 6A:
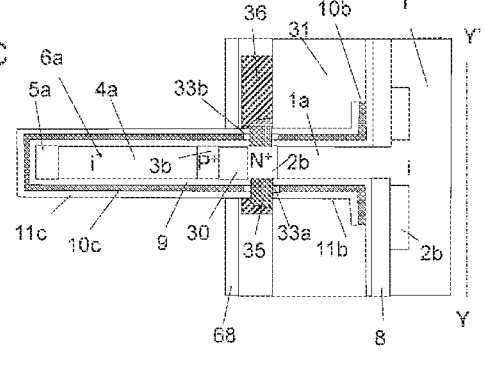

A formation of an SGT-including CMOS inverter circuit according to a sixth embodiment of the present invention will now be described with reference to FIGS. 6AA to 6CC. The formation of the circuit of the sixth embodiment is conducted by the same steps as those in the second embodiment except for structural differences described below.

The steps described with reference to FIGS. 2AA to 2CC are performed. Next, as illustrated in FIGS. 6AA to 6AC, a SiN layer 67 is formed so that the upper surface thereof is positioned higher than the upper surface of a Ni layer 36. Subsequently, a resist layer 68 is formed on the SiN layer 67 at the outer periphery of a Si pillar 6a.

Figure 6B:
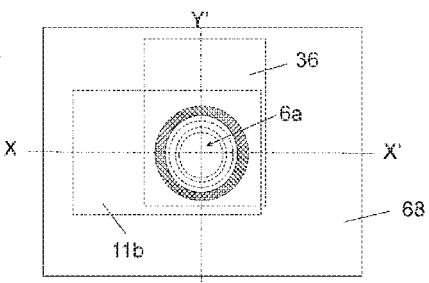
FIG. 6BA and FIGS. 6BB and 6BC are respectively a plan view and sectional structural views of the CMOS inverter circuit for explaining the method for producing an SGT-including semiconductor device according to the sixth embodiment.
Figure 6B:
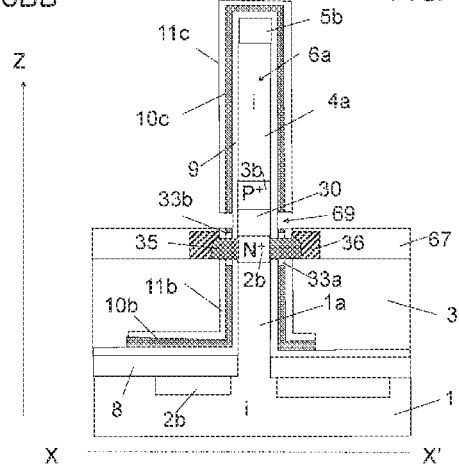
Figure 6B:
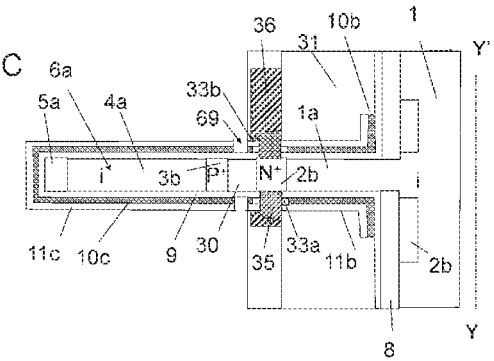

Next, as illustrated in FIGS. 6BA to 6BC, HF gas is supplied to the resist layer 68, and a SiO₂ layer 11c that is in contact with the resist layer 68 is etched by HF ions contained in the resist layer 68, and the resist layer 68 is then removed. Subsequently, a TiN layer 10c is etched by using the SiO₂ layer 11c as a mask, and a HfO₂ layer 9 is etched by using the SiO₂ layer 11c and the TiN layer 10c as a mask to form an opening 69.

Figure 6C:
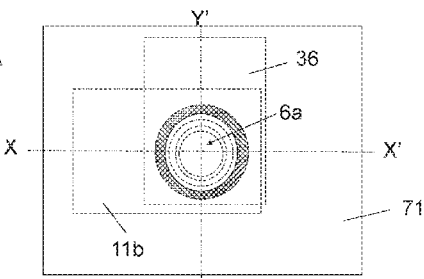
FIG. 6CA and FIGS. 6CB and 6CC are respectively a plan view and sectional structural views of the CMOS inverter circuit for explaining the method for producing an SGT-including semiconductor device according to the sixth embodiment.
Figure 6C:
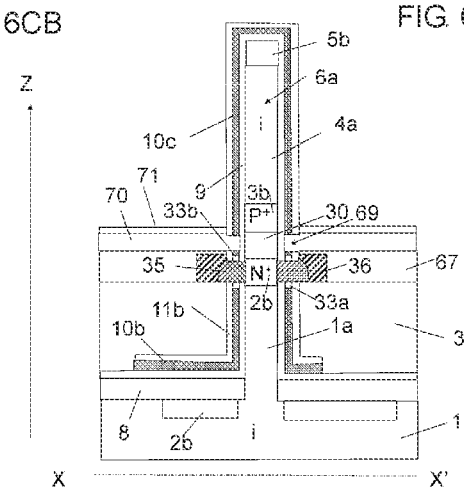
Figure 6C:
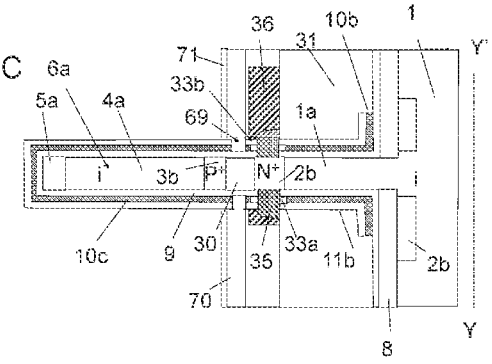

Next, as illustrated in FIGS. 6CA to 6CC, a SiO₂ layer 70 which fills the opening 69 and whose upper surface is positioned higher than the upper end of the opening 69 is formed by, for example, a flow CVD method. Subsequently, an aluminum oxide (Al₂O₃) layer 71 is formed on the SiO₂ layer 70 by, for example, sputtering deposition. Subsequently, the same steps as those described with reference to FIGS. 2DA to 2EC are performed to thereby form a circuit having two SGTs in the Si pillar 6a.

The method for producing a CMOS inverter circuit according to the sixth embodiment has the following advantage.

1. In the second embodiment, the TiN layer 10e, which is a conductor, is formed so as to surround the Si pillar 6a between the N⁺ region 2d and the P⁺ region 3b. Therefore, the coupling capacitance between the NiSi layer 39 and the NiSi layer 35 disposed above and under the TiN layer 10e is large. In contrast, in the present embodiment, since the TiN layer 10e is removed and the opening 69 is filled with the SiO₂ layer 70, which is an insulating layer, the coupling capacitance is significantly reduced compared with the structure of the second embodiment.

Seventh Embodiment

Figure 7A:
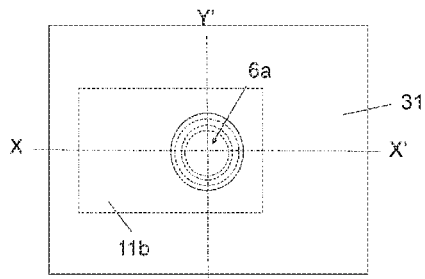
FIG. 7AA and FIGS. 7AB and 7AC are respectively a plan view and sectional structural views of a CMOS inverter circuit for explaining a method for producing an SGT-including semiconductor device according to a seventh embodiment of the present invention.
Figure 7A:
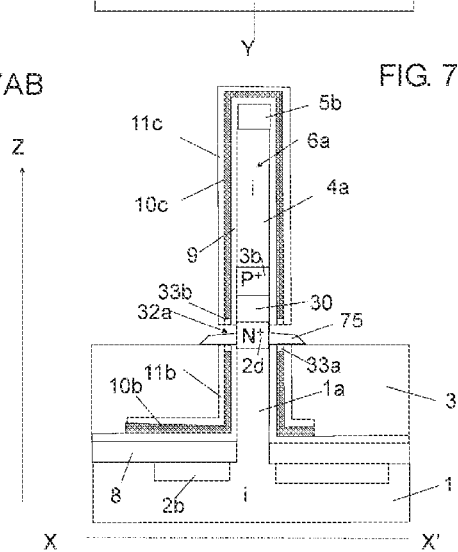
Figure 7A:
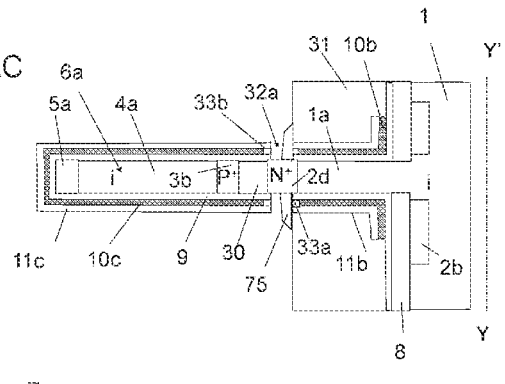

A formation of an SGT-including CMOS inverter circuit according to a seventh embodiment of the present invention will now be described with reference to FIGS. 7AA to 7BC. The formation of the circuit of the seventh embodiment is conducted by the same steps as those in the second embodiment except for structural differences described below.

The same steps as those described with reference to FIGS. 2AA to 2BC are performed. Subsequently, as illustrated in FIGS. 7AA to 7AC, a Si layer 75 which is in contact with the outer peripheral side surface of an N⁺ region 2d, which fills a bottom portion of an opening 32a, and whose outer circumference is located outside a SiO₂ layer 11c in plan view is formed by a Si selective epitaxial growth method. The upper surface of the Si layer 75 does not fill the entirety of the opening 32a.

Figure 7B:
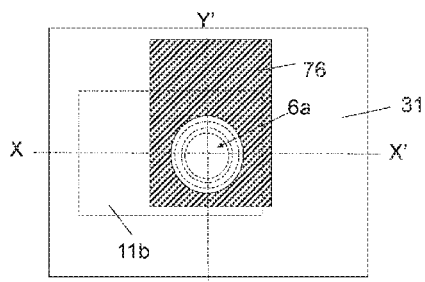
FIG. 7BA and FIGS. 7BB and 7BC are respectively a plan view and sectional structural views of the CMOS inverter circuit for explaining the method for producing an SGT-including semiconductor device according to the seventh embodiment.
Figure 7B:
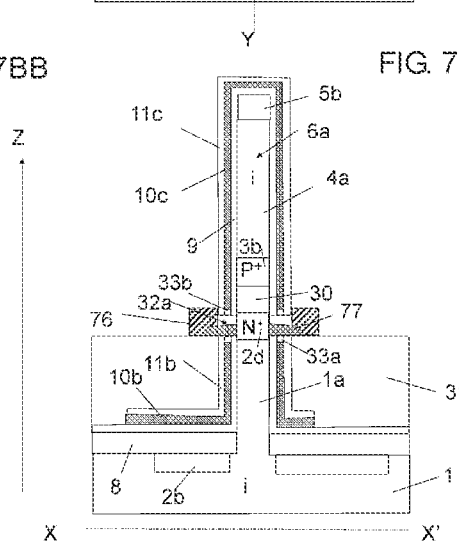
Figure 7B:
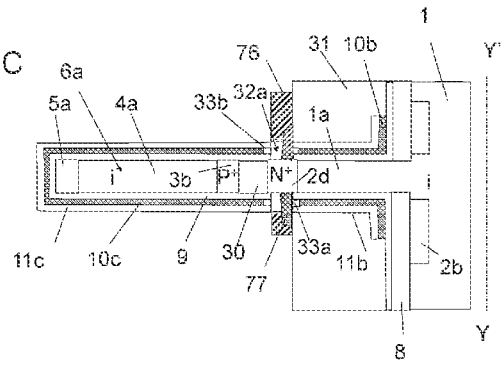

Next, as illustrated in FIGS. 7BA to 7BC, a Ni layer (not illustrated) is formed by, for example, a sputtering deposition method at the outer periphery of the SiO₂ layer 11c and on a SiN layer 31 so that the upper surface of the Ni layer is positioned above the opening 32a. Subsequently, a Ni layer 76 is formed by, for example, a lithography method and a RIE etching method. Subsequently, the Si layer is converted into a silicide by heat treatment to form a NiSi layer 77. Subsequently, the same steps as those described with reference to FIGS. 2DA to 2EC are performed. Thus, an SGT-including circuit is formed on an i-layer substrate 1.

The method for producing a circuit according to the seventh embodiment has the following advantages.

1. In the second embodiment, the entirety of the opening 32a is filled with the Si layer. In contrast, in the present embodiment, the Si layer is formed on a bottom portion of the opening 32a, and the upper surface of the Si layer is positioned apart from the top end of the opening 32a. In this case, since the NiSi layer 77, the N⁺ region 2d, and the Ni layer 76 are connected together, this structure does not impair the SGT performance. In the Si selective epitaxial growth method, Si atoms or molecules containing Si atoms, the Si atoms or the molecules reaching the surface of the SiN layer 31, move on the surface of the SiN layer 31, and crystals are grown in the horizontal direction and the vertical direction from the side surface of the N⁺ region 2d serving as a growth nucleus to form a Si layer. In this case, the unnecessity for filling the entirety of the opening 32a leads to ease of the production.

2. The volume of the NiSi layer 77, which is formed by converting the Si layer into a silicide, is increased due to the incorporation of Ni atoms in the Si layer (regarding the increase in the volume of a silicide layer due to silicidation, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). In the second embodiment, since such a space in the present embodiment is not present, a stress in the NiSi layer 35 generated during silicidation is directly applied to the Si pillar 6a, which may result in a problem such as bending of the Si pillar 6a. In contrast, in the present embodiment, since a space is present above the Si layer, the NiSi layer 77 generated during silicidation protrudes into this space, and the direct application of a stress to the Si pillar 6a is reduced. Accordingly, a problem such as bending of the Si pillar 6a is unlikely to occur.

Eighth Embodiment

Figure 8A:
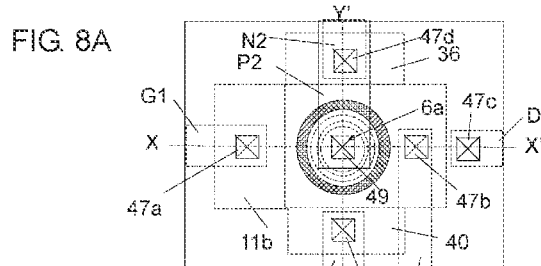
FIG. 8A and FIGS. 8B and 8C are respectively a plan view and sectional structural views of a CMOS inverter circuit for explaining a method for producing an SGT-including semiconductor device according to an eighth embodiment of the present invention.
Figure 8B:
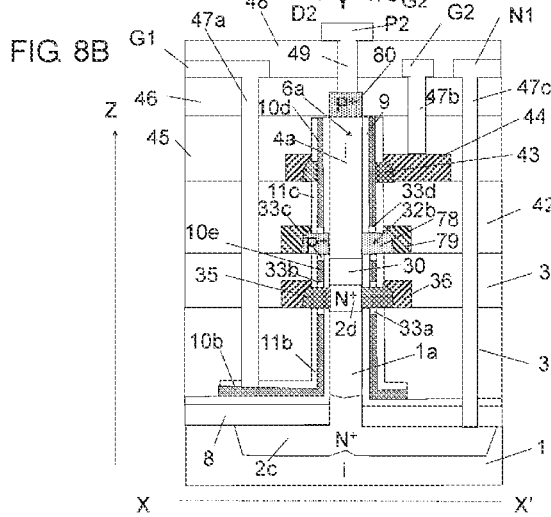
Figure 8C:
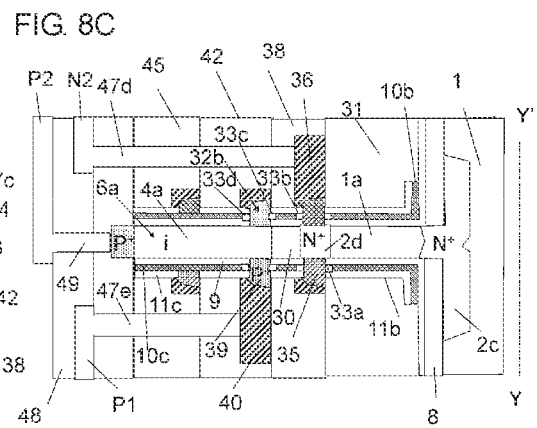

A formation of an SGT-including CMOS inverter circuit according to an eighth embodiment of the present invention will now be described with reference to FIGS. 8A to 8C.

In the second embodiment, the NiSi layer 39, which is formed by converting the selectively epitaxially grown Si layer (not shown) into a silicide, is formed so as to be in contact with the side surface of the P⁺ region 3b and to fill the opening 32b and so that the outer circumference of the NiSi layer 39 is located outside the outer circumference of the SiO₂ layer 11c in plan view. In contrast, in the eighth embodiment, as illustrated in FIGS. 8A to 8C, a P⁺ region 3b is not formed, and a silicon-germanium (SiGe) layer 78 containing an acceptor impurity and formed by selective heteroepitaxial growth is formed so as to be in contact with the side surface of a Si pillar 6a and to fill an opening 32b and so that the outer circumference of the SiGe layer 78 is located outside the outer circumference of a SiO₂ layer 11c in plan view. Subsequently, for example, a W layer 79 which is a wiring conductor layer is formed so as to surround the SiGe layer 78. Subsequently, in the top portion of the Si pillar 6a, a P⁺ region 80 that uses, as a base, SiGe containing an acceptor impurity and formed by a selective epitaxial growth method is formed instead of the P⁺ region 24a that uses Si as a base in the second embodiment. Except for the above, the same steps as those described in the second embodiment are performed. Thus, an SGT-including circuit can be formed on an i-layer substrate 1.

The method for producing a CMOS inverter circuit according to the eighth embodiment has the following advantage.

1. In the present embodiment, the SiGe layers 80 and 78 that are P⁺ regions and that are formed by a selective heteroepitaxial growth method are formed above and under the i-layer 4a serving as a channel of an upper SGT formed in the Si pillar 6a. A stress is generated due to the SiGe layers 78 and 80, and the distribution of the high-concentration acceptor impurity at the interface between the Si pillar 6a and the SiGe layer 78 and between the Si pillar 6a and the SiGe layer 80 can be changed in a stepwise manner. Therefore, an improvement in the mobility of holes traveling in the i-layer 4a which is a channel, and an improvement in the ON-state current can be realized (regarding the effects of improving the performance, refer to Shyam Gannavaram, Nemanja Pesovic & Mehmet C. Qzturk: "Low Temperature (<800° C.) Recessed Junction Selective Silicon-Germanium Source-Drain Technology for 70 nm CMOS" IEDM 2000 Technical Digest, pp. 437-440 (2000)). As a result, the performance of the SGT circuit can be improved.

Ninth Embodiment

A formation of an SGT-including CMOS inverter circuit according to a ninth embodiment of the present invention will now be described with reference to FIGS. 9A to 9C.

Figure 9A:
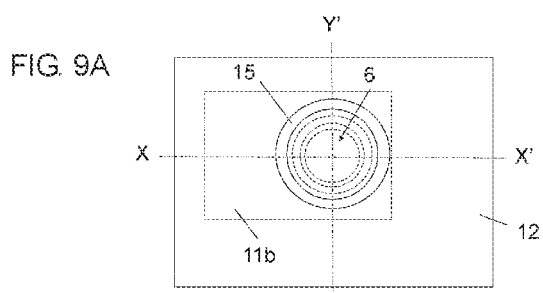
FIG. 9A and FIGS. 9B and 9C are respectively a plan view and sectional structural views of a CMOS inverter circuit for explaining a method for producing an SGT-including semiconductor device according to a ninth embodiment of the present invention.
Figure 9B:
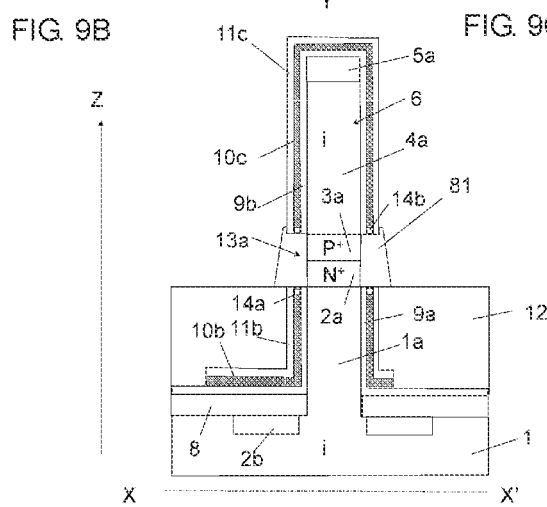
Figure 9C:
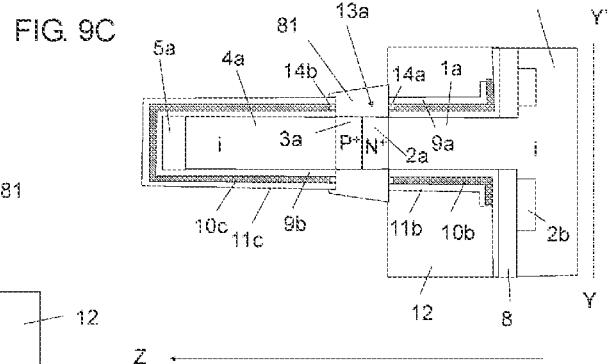

FIGS. 9A to 9C illustrate a step corresponding to FIGS. 1GA to 1GC in the first embodiment. A tungsten (W) layer 81 that is in contact with the outer peripheral side surfaces of an N⁺ region 2a and a P⁺ region 3a and that surrounds an opening 13a is formed by a W selective CVD growth method. In this case, the W layer 81 is formed so that the outer circumference of the W layer 81 is located outside the outer circumference of a SiO₂ layer 11c in plan view. Steps other than the step illustrated in FIGS. 9A to 9C are the same as those described in the first embodiment. However, the step of converting the Si layer 15 into a silicide is not necessary. Thus, an SGT-including circuit can be formed on an i-layer substrate 1.

In the first embodiment, the Si layer 15 is formed by a Si selective epitaxial growth method. In this case, since the N⁺ region 2a and the P⁺ region 3a that are in contact with the Si layer 15 are formed of single-crystal Si, the Si layer 15 is also epitaxially grown while the crystallographic axis thereof is aligned with the Si layers of the N⁺ region 2a and the P⁺ region 3a. In contrast, during the formation of the W layer 81, the W layer 81 is not epitaxially grown because atoms constituting the W layer 81 are different from atoms constituting the N⁺ region 2a and the P⁺ region 3a. The W layer 81 is selectively formed at the outer peripheries of the N⁺ region 2a and the P⁺ region 3a. This W layer 81 is formed by, for example, using the phenomenon that when a halide of W is reduced by a CVD method using the halide of W as a source gas, a W film is selectively formed only on a surface of a specific material. This selectivity is generated because the reduction rate of the halide of W is significantly different depending on the type of the surface material. Tungsten (W) is deposited on a surface of Si or a metal and is not deposited on an insulating film such as a SiO₂ film (regarding the details, refer to H. Itoh and T. Moriya, : "Tungsten Selective CVD and its applications to LSI Metallization", Journal of the Japan Institute of Metals and Materials, Vol.28, No.1, pp.48-54(1986)).

The method for producing a CMOS inverter circuit according to the ninth embodiment has the following advantages.

1. Since the W layer 81 is a conductive layer having a low resistance, it is not necessary to reduce the resistance by converting the Si layer 15 into a silicide as in the first embodiment. Accordingly, the step can be simplified, and the choice of the wiring material layer alternative to the Ni layer 16 can be increased.

2. In the W selective CVD method, a W layer 81 that contains an acceptor or donor impurity may be formed by introducing diborane or phosphine gas in reaction gas. In this case, the impurity can be diffused from the W layer 81 into a Si pillar 6 as in the fourth embodiment, and the same advantage as that in the fourth embodiment can be achieved.

The embodiments described above each relate to a method for producing a semiconductor device in which two SGTs are formed in one Si pillar. However, the technical idea of the present invention is not limited to this and is applicable to a method for producing a semiconductor device in which one semiconductor pillar has one SGT or three or more SGTs.

In the first embodiment and the second embodiment, an N-channel SGT is formed in a lower portion of the Si pillar 6, 6a and a P-channel SGT is formed in an upper portion of the Si pillar 6, 6a. The technical idea of the present invention is applicable to a circuit in which a P-channel SGT is formed in the lower portion and an N-channel SGT is formed in the upper portion. Furthermore, the technical idea of the present invention is applicable to the formation of a circuit that includes either N-channel SGTs or P-channel SGTs in both the upper and lower portions. This is also applicable to other embodiments according to the present invention.

In the first embodiment, the Si layer 15 is formed by a Si selective epitaxial growth method. Epitaxial growth is one of thin-film crystal growth techniques. Epitaxial growth is a growth form in which crystal growth is performed on a crystal serving as a substrate, and the grown crystals are aligned with the crystal plane of the substrate for the growth. Accordingly, the Si layer 15 in the first embodiment can be formed as a single crystal. However, as illustrated in FIGS. 1IA to 1IC, the reduction in the resistance of the Si layer 15 is performed by silicidation by the Ni layer 16, and the Si layer 15 is converted into the NiSi layer 15a. Therefore, it is not essential that the Si layer 15 be formed of a single crystal. Accordingly, the Si layer 15 may be selectively formed by a CVD method so as to be in contact with the side surfaces of the N⁺ region 2a and the P⁺ region 3a. The same applies to other embodiments according to the present invention.

In the above modification of the first embodiment, the Si layer 15 is selectively formed by a CVD method so as to be in contact with the side surfaces of the N⁺ region 2a and the P⁺ region 3a. In the ninth embodiment, the W layer 81 is selectively formed by a CVD method so as to be in contact with the side surfaces of the N⁺ region 2a and the P⁺ region 3a. Another method other than the CVD method, for example, a molecular beam method or a liquid-phase method, may be employed as long as the layer is selectively formed so as to be in contact with the side surfaces of the N⁺ region 2a and the P⁺ region 3a. The same applies to other embodiments according to the present invention.

In the first embodiment, the SiN layer 12 is used as an underlying layer of the Si layer 15. In the Si selective epitaxial growth, it is desirable that Si atoms be unlikely to be deposited on the surface of a material layer located at the outer periphery of the portion where epitaxial growth occurs. Another material layer formed of a single layer or a plurality of layers may be used instead of the SiN layer 12 as long as this condition is satisfied. In this process of forming the Si layer 15, Si molecules adsorbed on the surface of the SiN layer 12 are preferably deposited under the supply-limited conditions in which after the Si molecules reach the surface of the SiN layer 12, the Si molecules move a long distance on the surface of the SiN layer 12. The same applies to other embodiments according to the present invention.

In the first embodiment, a single layer of the Si layer 15 is selectively formed by a selective CVD method so as to be in contact with the side surfaces of the N⁺ region 2a and the P⁺ region 3a. Alternatively, another material layer formed of a single layer or a plurality of layers may be formed instead of or in addition to the single-layer Si layer 15 by a selective CVD method so as to be in contact with the side surfaces of the N⁺ region 2a and the P⁺ region 3a. In this case, in plan view, the outer circumference of an inner layer may be located within the outer circumference of the SiO₂ layer 11c, however, the outer circumference of the outermost layer needs to be located outside the outer circumference of the SiO₂ layer 11c. For example, after the formation of the Si layer 15, a W layer may be selectively deposited by a selective CVD method. The same applies to other embodiments according to the present invention. A buffer metal layer for reducing the contact resistance with an impurity region may be disposed as the innermost layer. For example, in the ninth embodiment, a Ti layer or a TiN layer may be disposed between the W layer 81 and the N⁺ region 2a and between the W layer 81 and the P⁺ region 3*a*. The same applies to other embodiments according to the present invention.

In the first embodiment, the resist layer 7 containing HF ions is formed on the entire outer periphery of the SiO₂ layer 11*a* in plan view, and the opening 13*a* connecting to the entire outer periphery of the Si pillar 6 is formed as illustrated in FIGS. 1FA to 1FC. Alternatively, a resist layer is formed by a lithography method so as to be in contact with a part of the outer periphery of the SiO₂ layer 11*a* in plan view, and the same step as the step of forming an opening in the first embodiment is then performed. As a result, an opening can be formed on the part of the outer periphery of the Si pillar 6 in plan view. This structure also realizes the connection between the N⁺ region 2*a* and the P⁺ region 3*a*, and the NiSi layer 15*a* and the Ni layer 16. In this case, in the inverter circuit illustrated in FIGS. 1LA to 1LC, the TiN layers 10*b* and 10*d* of gate electrodes are connected to each other. This is advantageous in that the step of forming the NiSi layer 21 and Ni layer 22 connected to the TiN layer 10*d* can be made unnecessary. The same applies to other embodiments according to the present invention.

In the first embodiment, Ni atoms are injected in a direction perpendicular to the upper surface of the i-layer substrate 1 by a bias sputtering method to deposit the Ni layer 16 on the SiN layer 12 and the top portion of the Si pillar 6. In the bias sputtering method employed here, a radiofrequency (RF) voltage is applied to a counter electrode plate distant from the i-layer substrate 1 while applying a voltage to the substrate electrode plate to thereby deposit Ni atom ions over the i-layer substrate 1. Any method other than the bias sputtering method may be employed as long as the Ni layer 16 can be formed by injecting Ni atoms in a direction perpendicular to the upper surface of the i-layer substrate 1. Such a method is also applicable to the formation of the upper Ni layer 22. Instead of the Ni layers 16 and 22, conductor layers made of another conductor material may be formed for the same purpose as that relating to the present invention. In this case, a method other than the bias sputtering method can also be employed as described above. Such a method is also applicable to other embodiments according to the present invention.

In the first embodiment, the Si pillar 6 whose side surface forms a substantially right angle (about 90°) with respect to the upper surface of the i-layer substrate 1 is formed. Since the angle of the side surface of the Si pillar 6 is a substantially right angle with respect to the upper surface of the i-layer substrate 1, deposition of Ni atoms on the side surface of the SiO₂ layer 11*c* surrounding the outer periphery of the Si pillar 6 is prevented. The angle formed between the side surface of the Si pillar 6 and the upper surface of the i-layer substrate 1 when viewed from the inside of the Si pillar 6 may be less than 90° (specifically, the side surface of the Si pillar 6 may be inclined toward the interior of the Si pillar 6) as long as Ni atoms are not deposited on the side surface of the SiO₂ layer 11*c* surrounding the outer periphery of the Si pillar 6. For example, in the bias sputtering method, deposition of Ni atoms on the side surface of the SiO₂ layer 11*c* can be prevented by controlling the bias voltage applied between the substrate electrode plate on which the i-layer substrate 1 is disposed and the counter electrode plate distant from the i-layer substrate 1 (regarding the basic method relating to this, refer to C. Y. Ting, V. J. Vivalda, and H. G. Schaefer: "Study of planarized sputter-deposited SiO₂," J. Vac. Sci. Technol, 15(3), May/Jun (1978)). Even if Ni atoms are deposited on the side surface of the SiO₂ layer 11*c*, no problem occurs as long as, for example, the Ni atoms can be easily removed with a diluted hydrofluoric acid or the like. This is also applicable to the formation of the upper Ni layer 22. Furthermore, this is also applicable to other embodiments according to the present invention. When the angle formed between the side surface of the Si pillar 6 and the upper surface of the i-layer substrate 1 when viewed from the inside of the Si pillar 6 is more than 90° (specifically, when the side surface of the Si pillar 6 is inclined toward the exterior of the Si pillar 6), the top portion of the Si pillar 6 functions as a shield of Ni atoms, and thus the Ni atoms obviously do not deposit on the side surface of the Si pillar 6.

In the first embodiment, the openings 13*a* and 13*b* are formed by a method including supplying HF gas to the resist layer 7, and etching the SiO₂ layer 11*a* by generated HF ions. Alternatively, a resist layer 7 containing HF ions, an organic material layer containing HF ions, or an inorganic material layer containing HF ions may be formed, and the SiO₂ layer 11*a* may be etched. The openings may be formed by another method. The same applies to other embodiments according to the present invention.

In the first embodiment, as described in FIGS. 1FA to 1FC, exposed end portions of the TiN layers 10*b* and 10*c* are respectively oxidized to form the TiO layers 14*a* and 14*b*, which are insulating layers. Alternatively, insulating layers containing nitrogen (N) may be formed by nitridation. Insulating layers may be formed by another method. The same applies to other embodiments according to the present invention.

The SiN layers 12 and 20 in the first embodiment may each be another material layer (for example, a SiO₂ layer) which is formed of a single layer or a plurality of layers and on which a SiN layer is stacked on a surface layer. Since the SiN layers 12 and 20 function as stopper layers when the openings 13*a* and 13*b* are formed by HF ion etching, a material layer having a small diffusion coefficient of HF ions, such as the SiNO layer 58 used in the third embodiment, may be used. In the embodiment, the openings 13*a* and 13*b* are formed by an etching method with HF ions. However, when the openings 13*a* and 13*b* are formed by another method, a single material layer or a plurality of material layers may be used as long as the structure and electrical characteristics are not adversely affected. This is also applicable to other embodiments according to the present invention.

In FIGS. 1LA to 1LC describing the first embodiment, no NiSi layer is formed in surface layers on the side surfaces of the N⁺ region 2*a* and the P⁺ region 3*a* that are in contact with the NiSi layer 15*a*. However, a NiSi layer may be formed in the surface layers on the side surfaces of these regions as in the fifth embodiment. For example, in the heat treatment for forming the NiSi layer 15*a*, diffusion of Ni atoms is accelerated by an extension of the heating time and/or an increase in the heating temperature or additional heat treatment so as to diffuse the Ni atoms to the N⁺ region 2*a* and the P⁺ region 3*a*. Thus, a NiSi layer can be formed in the surface layers on the side surfaces of the N⁺ region 2*a* and the P⁺ region 3*a*. This NiSi layer may be formed to extend to the center of the Si pillar 6. This is also applicable to other embodiments according to the present invention.

In the first embodiment, gate conductor layers are formed of the TiN layers 10*b* and 10*d*. However, the gate conductor layers are not limited to this and may be formed of another metal material. The gate conductor layers may each be formed of a multilayer structure that includes a metal layer and, for example, a poly-Si layer. This is also applicable to other embodiments according to the present invention.

In the first embodiment, the Ni layer 16 is used as a wiring conductor layer in contact with the Si layer 15. Alternatively, a layer made of another meal such as cobalt (Co) or tungsten (W) capable of converting a Si layer into a silicide may be used instead of the Ni layer 16. Alternatively, for example, a silicide layer such as a NiSi layer may be used instead of the Ni layer because the use of such a silicide layer also enables the Si layer 15 to be converted into a silicide. This is also applicable to other embodiments according to the present invention.

In the first embodiment, the description has been made using steps of first forming the Si pillar 6 and subsequently forming the HfO$_2$ layer 9 which is a gate insulating layer and the gate TiN layer 10. Alternatively, for example, a hole may be formed in a SiO$_2$ film, a TiN layer and a HfO$_2$ layer may be deposited by an ALD method in the hole, bottom portions of the TiN layer and the HfO$_2$ layer may be removed, and a Si pillar may then be formed by a Si epitaxial growth method. Alternatively, a TiN layer and a HfO$_2$ layer may be continuously deposited, by an ALD method, inside the formed hole, and the hole may then be continuously filled with a Si layer by an ALD method to form a Si pillar. In such a case, the original SiO$_2$ film in which the hole is formed needs to be removed after the formation of the Si pillar 6. This is also applicable to other embodiments according to the present invention.

In the first embodiment, the description has been made using, as the gate conductor layers of the upper and lower SGTs, the TiN layers 10b and 10d made of the same material. Alternatively, layers made of another gate material may be used. Alternatively, the upper layer and the lower layer may be formed by using different materials. This is also applicable to other embodiments according to the present invention.

In the first embodiment, Ni layers (not illustrated) are stacked, the Ni layers 16 and 22 are formed from the Ni layers, and the NiSi layers 15a and 21 are then respectively formed by silicidation. Alternatively, after Ni layers are stacked, the NiSi layers 15a and 21 may be formed by silicidation, and the Ni layers 16 and 22 may then be formed.

In the seventh embodiment, the Si layer 75 which is in contact with the outer peripheral side surface of the N$^+$ region 2d, which fills a bottom portion of the opening 32a, and whose outer circumference is located outside the SiO$_2$ layer 11c in plan view is formed by a Si selective epitaxial growth method. In this case, the upper surface of the Si layer 75 is distant from the lower end of the SiO$_2$ layer 11c so as not to fill the entirety of the opening 32a. This shape of the Si layer 75 is also applicable to other material layers, for example, the SiGe layer 78 in the eighth embodiment and the W layer 81 in the ninth embodiment. The present invention is also applicable to formation of an impurity region corresponding to a bottom portion of the Si pillar 6a. When the Si layer 75 is an impurity layer containing a donor impurity in a large amount, the Si layer 75 functions as a source or a drain. Accordingly, the N$^+$ regions 2b and 2d may be formed in the Si pillar 6a in advance, or the formation of the N$^+$ regions 2b and 2d may be omitted. This is also applicable to other embodiments according to the present invention.

In the first embodiment, Ni layers (not illustrated) are stacked, the Ni layers 16 and 22 are formed from the Ni layers, and the NiSi layers 15a and 21 are then respectively formed by silicidation. Alternatively, after the formation of the Si layer 15, a Ni layer may be deposited so as to cover the Si layer 15, the NiSi layer 15a may be formed by performing heat treatment, and the Ni layer 16 may then be formed by, for example, a lithography method and a RIE method. Similarly, after the formation of the NiSi layer 21, the Ni layer 22 may be formed. This is also applicable to other embodiments according to the present invention.

In the first embodiment, Ni layers (not illustrated) are stacked, the Ni layers 16 and 22 are formed from the Ni layers, and the NiSi layers 15a and 21 are then respectively formed by silicidation. Alternatively, after the formation of the Si layer 15, a thin Ni layer may be deposited over the entirety by an ALD method, and the NiSi layer 15a may be formed by performing heat treatment. In this case, after the formation of the NiSi layer 15a, the remaining Ni layer is removed. Accordingly, another wiring conductor layer can be used instead of the Ni layer 16 without silicidation of the Si layer 15. Similarly, the Ni layer 22 can be replaced by another wiring conductor layer. This leads to an increase in the choice of the material of the wiring conductor layer. This is also applicable to other embodiments according to the present invention.

In the third embodiment, after the SiN layer 52 is formed so as to cover the Si pillar 6b, the SiO$_2$ layer 53 is formed. Alternatively, the SiO$_2$ layer 53 may be formed before the formation of the SiN layer 52.

In the eighth embodiment, the SiGe layer 78 is in contact with the outer peripheral side surface of the Si pillar 6a. Alternatively, in the step of forming the opening 32b, the surface of the exposed Si pillar 6a may be etched so that the surface layer of the Si pillar 6a is inwardly curved. As a result, the stress effect and the current injection effect of the SiGe layer 78 can be further improved.

In the eighth embodiment, the SiGe layer 78 containing an acceptor impurity is formed so as to surround the Si pillar 6a. The acceptor impurity contained in the SiGe layer 78 is diffused into the Si pillar 6a by the subsequent heat treatment. In this case, when the structure is closely observed, a P$^+$ region is formed inside the side surface of the Si pillar 6a.

In the eighth embodiment, the SiGe layers 78 and 80 which contain an acceptor impurity and which are P$^+$ regions are formed in a drain and a source of the upper SGT out of the two SGTs formed in the Si pillar 6a. However, the present invention is also applicable to the lower SGT out of the two SGTs formed in the Si pillar 6a. In this case, the SiGe layer formed at the bottom portion of the Si pillar 6a is formed by the method described in the third embodiment. The present invention is also applicable to the case in which three or more SGTs are formed in one Si pillar 6a.

In the eighth embodiment, the SiGe layers 78 and 80 containing an acceptor impurity are used as the P$^+$ regions. The P$^+$ regions may be formed of another semiconductor atomic composition as long as the same advantage is achieved. Alternatively, the P$^+$ regions may be formed of another semiconductor atomic composition as long as the function of a source or a drain of an SGT can be achieved. The respective P$^+$ regions may be formed of different semiconductor atomic compositions.

In the eighth embodiment, the W layer 79 is formed on the SiGe layer 78 so as to be in direct contact with the SiGe layer 78. Alternatively, after the SiGe layer 78 is formed by a selective epitaxial growth method, a Si layer may be continuously formed as a buffer layer by, for example, a selective epitaxial growth method. Alternatively, a conductive layer formed of a single another material layer or a plurality of other material layers may be used instead of the W layer 79.

In the first embodiment, a SOI substrate can be used instead of the i-layer substrate 1. In addition, a well structure that forms an N-type or P-type impurity region may be provided in an upper surface of the i-layer substrate 1. These are also applicable to other embodiments according to the present invention.

In the ninth embodiment, the W layer 81 is formed. Alternatively, a metal material different from W may be formed by a selective CVD method.

In the embodiments described above, examples in which a silicon (Si) pillar is used as a semiconductor pillar have been described. However, the technical idea of the present invention is not limited to this and is also applicable to an SGT-including semiconductor device that uses a semiconductor pillar made of a semiconductor material other than silicon.

In the embodiments described above, the description has been made of an example in which impurity regions that form a source and a drain disposed in an upper portion and a lower portion of an SGT have the same conductivity type. The present invention is also applicable to a tunnel effect SGT in which impurity regions of a source and a drain have different conductivity types.

In the embodiments described above, SGTs have a structure in which gate insulating layers formed of, for example, the $HfO_2$ layers 9a and 9b are formed at the outer periphery of a semiconductor pillar such as the Si pillar 6, and gate conductor layers formed of, for example, the TiN layers 10b and 10d are formed at the outer periphery of the gate insulating layers. However, the structure is not limited to this. Since a flash memory element that has a conductor layer electrically floating between a gate conductor layer and a gate insulating layer or, for example, a charge storage layer such as a SiN layer is also a type of SGTs, the technical idea of the present invention can be applied to a method for producing such a flash memory element.

It is to be understood that various embodiments and modifications of the present invention are possible without departing from the broad spirit and scope of the present invention. The embodiments described above are illustrative examples of the present invention and do not limit the scope of the present invention. The embodiments and modifications can be appropriately combined. Furthermore, some of constituent features of the above embodiments may be omitted as required. Such embodiments still fall within the technical scope of the present invention.

According to a pillar-shaped semiconductor device and a method for producing the pillar-shaped semiconductor device of the present invention, a highly integrated semiconductor device is obtained.

What is claimed is:

1. A method for producing a pillar-shaped semiconductor device, comprising:
    (a) forming, on a substrate, a semiconductor pillar that stands in a first direction perpendicular to a surface of the substrate;
    (b) forming, so as to surround the semiconductor pillar, a first material layer either inclusive or exclusive of a gate conductor layer, wherein an outermost layer of the first material layer is single or multi-layered and is surrounded by a first insulating layer;
    (c) forming, so as to surround the first material layer, a second insulating layer having an upper surface positioned lower than a top portion of the semiconductor pillar;
    (d) removing a part of the first material layer to expose a side surface of the semiconductor pillar or a side surface of the gate conductor layer to form an opening in the first material layer so that a lower end of the opening is positioned as high as the upper surface of the second insulating layer in the first direction;
    (e) forming a connection material layer, which contains a semiconductor, so that the connection layer is in contact with the exposed side surface of the semiconductor pillar or the side surface of the gate conductor layer, wherein the connection material layer has an outer circumference extensive in a second direction perpendicular to the first direction beyond an outer circumference of the first material layer, and the connection material layer is formed by a selective deposition method so that the connection material layer is selectively deposited on the exposed side surface of the semiconductor pillar or the side surface of the gate conductor layer but not deposited on a surface of the first insulating layer or a surface of the second insulating layer; and
    (f) forming a wiring conductor layer over the second insulating layer so that the wiring conductor layer at least partially surrounds the connection material layer, and the connection material layer functions as a source or a drain.

2. The method for producing a pillar-shaped semiconductor device according to claim 1, further comprising between Step (d) and Step (e), removing a surface layer of the side surface of the semiconductor pillar in the opening.

3. The method for producing a pillar-shaped semiconductor device according to claim 1, further comprising:
    forming, so as to surround the first material layer, a third insulating layer having an upper surface positioned lower than the top portion of the semiconductor pillar;
    removing a part of the first material layer to expose a side surface of the gate conductor layer to form a second opening in the first material layer so that a lower end of the second opening is positioned as high as an upper surface of the third insulating layer in the first direction;
    forming a second connection material layer, so that the second connection layer is in contact with the exposed side surface of the gate conductor layer, and wherein the second connection material layer has an outer circumference extensive in the second direction beyond the outer circumference of the first material layer, and second connection layer is formed by the selective deposition method so that the second connection material layer is selectively deposited on the exposed side surface of the gate conductor layer but not deposited on the surface of the first insulating layer or a surface of the third insulating layer; and
    forming a second wiring conductor layer in contact with the second connection material layer, wherein the second wiring conductor layer extends onto the third insulating layer.

4. The method for producing a pillar-shaped semiconductor device according to claim 1, wherein forming a connection material layer by the selective deposition method includes forming the connection material layer that contains an acceptor impurity, and
    the method further comprises a step of forming a second connection material layer that contains an acceptor impurity by the selective deposition method, wherein the second connection material layer is located above or below a part of the semiconductor pillar surrounded by the gate conductor layer.

* * * * *